(12) United States Patent
Kim

(10) Patent No.: US 12,317,691 B2
(45) Date of Patent: May 27, 2025

(54) DISPLAY DEVICE HAVING ORGANIC PLANARIZATION LAYER WITH VALLEY AND PROTRUSION STRUCTURES

(71) Applicant: Samsung Display Co., LTD., Yongin-si (KR)

(72) Inventor: Cha Dong Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 477 days.

(21) Appl. No.: 17/712,522

(22) Filed: Apr. 4, 2022

(65) Prior Publication Data

US 2023/0038990 A1    Feb. 9, 2023

(30) Foreign Application Priority Data

Aug. 4, 2021   (KR) .......................... 10-2021-0102461

(51) Int. Cl.
  *H10K 59/122* (2023.01)
  *G06F 3/044* (2006.01)
  *H10K 59/35* (2023.01)
  *H10K 59/40* (2023.01)

(52) U.S. Cl.
  CPC ......... *H10K 59/122* (2023.02); *G06F 3/0446* (2019.05); *H10K 59/353* (2023.02); *H10K 59/40* (2023.02)

(58) Field of Classification Search
  CPC .............................. H10K 59/40; H10K 59/122
  See application file for complete search history.

(56) References Cited

U.S. PATENT DOCUMENTS

| 5,919,555 | A | * | 7/1999 | Yasuda | ..................... C08J 7/043 428/421 |
|---|---|---|---|---|---|
| 11,069,759 | B2 | | 7/2021 | Kim et al. | |
| 11,581,515 | B2 | | 2/2023 | Baek et al. | |
| 11,839,107 | B2 | | 12/2023 | Baek et al. | |
| 11,844,242 | B2 | | 12/2023 | Kim et al. | |

(Continued)

FOREIGN PATENT DOCUMENTS

| KR | 10-1983-0002318 | 10/1983 |
|---|---|---|
| KR | 10-1992-0017271 | 9/1992 |

(Continued)

OTHER PUBLICATIONS

Extended European search report for European Patent Application or Patent No. 22186149.5 dated Dec. 27, 2022.

*Primary Examiner* — Jay C Chang
*Assistant Examiner* — Mikka Liu
(74) *Attorney, Agent, or Firm* — KILE PARK REED & HOUTTEMAN PLLC

(57) ABSTRACT

A display device includes a plurality of sub-pixels disposed on a display area of the display device and including a first electrode, a light emitting layer, and a second electrode, a pixel-defining layer defining emission areas of the plurality of sub-pixels, respectively, an organic planarization layer disposed on the pixel-defining layer and comprising one or more valleys overlapping a first area in a plan view and at least one protrusion overlapping a second area in a plan view, and a high-refractive planarization layer disposed on the organic planarization layer. The first area is located at an edge of the display area. A second area is located in a non-display area of the display device.

21 Claims, 26 Drawing Sheets

(56) References Cited

U.S. PATENT DOCUMENTS

| | | | |
|---|---|---|---|
| 2016/0293894 A1 | 10/2016 | Cheng et al. | |
| 2018/0039117 A1* | 2/2018 | Ikeda | H10K 59/878 |
| 2020/0227489 A1* | 7/2020 | Kim | H10K 50/856 |
| 2020/0243802 A1* | 7/2020 | Ju | H10K 59/879 |
| 2021/0013452 A1 | 1/2021 | Kim et al. | |
| 2024/0032328 A1 | 1/2024 | Baek et al. | |

FOREIGN PATENT DOCUMENTS

| | | |
|---|---|---|
| KR | 10-2020-0058643 | 5/2020 |
| KR | 10-2020-0085968 | 7/2020 |
| KR | 10-2021-0054830 | 5/2021 |

* cited by examiner

DISPLAY DEVICE HAVING ORGANIC PLANARIZATION LAYER WITH VALLEY AND PROTRUSION STRUCTURES

CROSS-REFERENCE TO RELATED APPLICATION(S)

This application claims priority to and benefits of Korean Patent Application No. 10-2021-0102461 under 35 U.S.C. § 119 filed in the Korean Intellectual Property Office (KIPO) on Aug. 4, 2021, the entire contents of which are incorporated herein by reference.

BACKGROUND

1. Technical Field

The disclosure relates to a display device capable of reducing a difference in luminance at an edge of a display area to prevent mura (or chrominance non-uniformity).

2. Description of the Related Art

As the information-oriented society evolves, various demands for display devices are ever increasing. For example, display devices are used in various electronic devices such as smartphones, digital cameras, laptop computers, navigation devices, and smart televisions.

Display devices may be flat panel display devices such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

Among display devices, an organic light-emitting display device includes a self-luminous element, e.g., an organic light-emitting element. An organic light-emitting element may include two opposing electrodes and a light emitting layer interposed therebetween. In an organic light-emitting element, electrons and holes supplied from the two electrodes are recombined in the light emitting layer to generate excitons, the generated excitons relax from the excited state to the ground state, and accordingly light can be emitted.

Such an organic light-emitting element requires no separate light source such as a backlight unit, and thus it consumes less power and can be made light and thin, as well as exhibiting high-quality characteristics such as wide viewing angle, high luminance and contrast, and fast response speed. Accordingly, organic light-emitting display devices are attracting attention as the next generation display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of reducing a difference in luminance at an edge of a display area to prevent mura (or chrominance non-uniformity).

It should be noted that objects of the disclosure are not limited to the above-mentioned object; and other objects of the disclosure will be apparent to those skilled in the art from the following descriptions.

According to an embodiment of the disclosure, the display device comprises a plurality of sub-pixels disposed on a display area of a display device and comprising a first electrode, a light emitting layer, and a second electrode, a pixel-defining layer defining emission areas of the plurality of sub-pixels, respectively, an organic planarization layer disposed on the pixel-defining layer and comprising one or more valleys overlapping a first area in a plan view and at least one protrusion overlapping the second area, and a high-refractive planarization layer disposed on the organic planarization layer. The first area is located at an edge of the display area. A second area is located in a non-display area of the display device.

In an embodiment, the first area may be located at least one edge of the display area, and the second area may contact the first area and surround the display area in a plan view.

In an embodiment, the second area may be extended from a sidewall of the organic planarization layer overlapping the non-display area in a plan view toward the display area.

In an embodiment, the one or more valleys may surround the plurality of sub-pixels disposed in the first area in a plan view, and may not overlap the emission areas of the plurality of sub-pixels in a plan view.

In an embodiment, the organic planarization layer may comprise openings overlapping the emission areas of the plurality of sub-pixels in a plan view, and the one or more valleys may surround the openings in a plan view.

In an embodiment, the display device may further comprise a touch sensor layer disposed between the pixel-defining layer and the organic planarization layer, and the touch sensor layer may comprise driving electrodes and sensing electrodes. A width of the one or more valleys may be smaller than a distance between the driving electrodes and the openings in a plan view.

In an embodiment, the one or more valleys may have a depth from an upper surface of the organic planarization layer. The depth may be in a range from about 10% to about 70% of a thickness of the organic planarization layer.

In an embodiment, the one or more valleys surrounding one of the plurality of sub-pixels may comprise a plurality of valleys, and the plurality of valleys may comprise a first valley adjacent to the emission area and a second valley surrounding the first valley.

In an embodiment, a width and a depth of the first valley may be equal to a width and a depth of the second valley, respectively.

In an embodiment, a depth of the first valley may be greater than a depth of the second valley.

In an embodiment, the at least one protrusion may surround the display area and protrudes from an upper surface of the organic planarization layer.

In an embodiment, a taper angle of the at least one protrusion may be in a range of about 10 degrees to about 30 degrees with respect to the upper surface of the organic planarization layer.

In an embodiment, a height of the at least one protrusion may be in a range of about 1% to about 10% of a thickness of the organic planarization layer.

In an embodiment, the at least one protrusion may comprise a plurality of protrusions, and the plurality of protrusions may comprise a first protrusion adjacent to the first area and a second protrusion surrounding the first protrusion.

In an embodiment, a height of the first protrusion may be equal to a height of the second protrusion.

In an embodiment, a height of the first protrusion may be smaller than a height of the second protrusion.

In an embodiment, the display device may further comprise a third protrusion surrounding the second protrusion, and heights of the first protrusion, the second protrusion, and the third protrusion may decrease toward the display area.

In an embodiment, the protrusion may have an island pattern or a closed-loop shape.

According to an embodiment of the disclosure, the display device comprises a plurality of sub-pixels disposed on a display area of a display device and comprising a first electrode, a light emitting layer, and a second electrode, a pixel-defining layer defining emission areas of the plurality of sub-pixels, respectively, an organic planarization layer disposed on the pixel-defining layer and comprising valleys overlapping a first area located at an edge of the display area in a plan view, and a high-refractive planarization layer disposed on the organic planarization layer. The valleys surround the plurality of sub-pixels adjacent to each other and are spaced apart from each other. Widths of the valleys spaced apart from each other gradually decrease from the display area toward a non-display area of the display device.

In an embodiment, the plurality of sub-pixels may comprise a first sub-pixel, a second sub-pixel, and a third sub-pixel. The first sub-pixel, the second sub-pixel, and the third sub-pixel may be adjacent to each other in a direction from the non-display area to the display area. The valleys may comprise a first valley surrounding the first sub-pixel, a second valley surrounding the second sub-pixel, and a third valley surrounding the third sub-pixel. A width of the second valley may be greater than a width of the first valley, and a width of the third valley may be greater than the width of the second valley.

In an embodiment, volumes of the valleys may be different from each other, and gradually decrease from the display area toward the non-display area.

According to the embodiments of the disclosure, valleys are formed in an organic planarization layer at an edge of a display area of a display device to reduce the volume of the organic planarization layer. Thus, a hump of a high-refractive planarization layer may be lowered. A protrusion of the organic planarization layer may be formed in the non-display area adjacent to the display area, and thus the thickness of the high-refractive planarization layer may be increased by the protrusion. Thus, the thickness uniformity of the high-refractive planarization layer may be improved in the entire display area. Therefore, the issue of mura (or chrominance non-uniformity) resulted from a difference in luminance may be addressed. For example, the difference in luminance may be reduced at the edge of the display area to prevent the mura (or chrominance non-uniformity).

It should be noted that effects of the disclosure are not limited to those described above and other effects of the disclosure will be apparent to those skilled in the art from the following descriptions.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
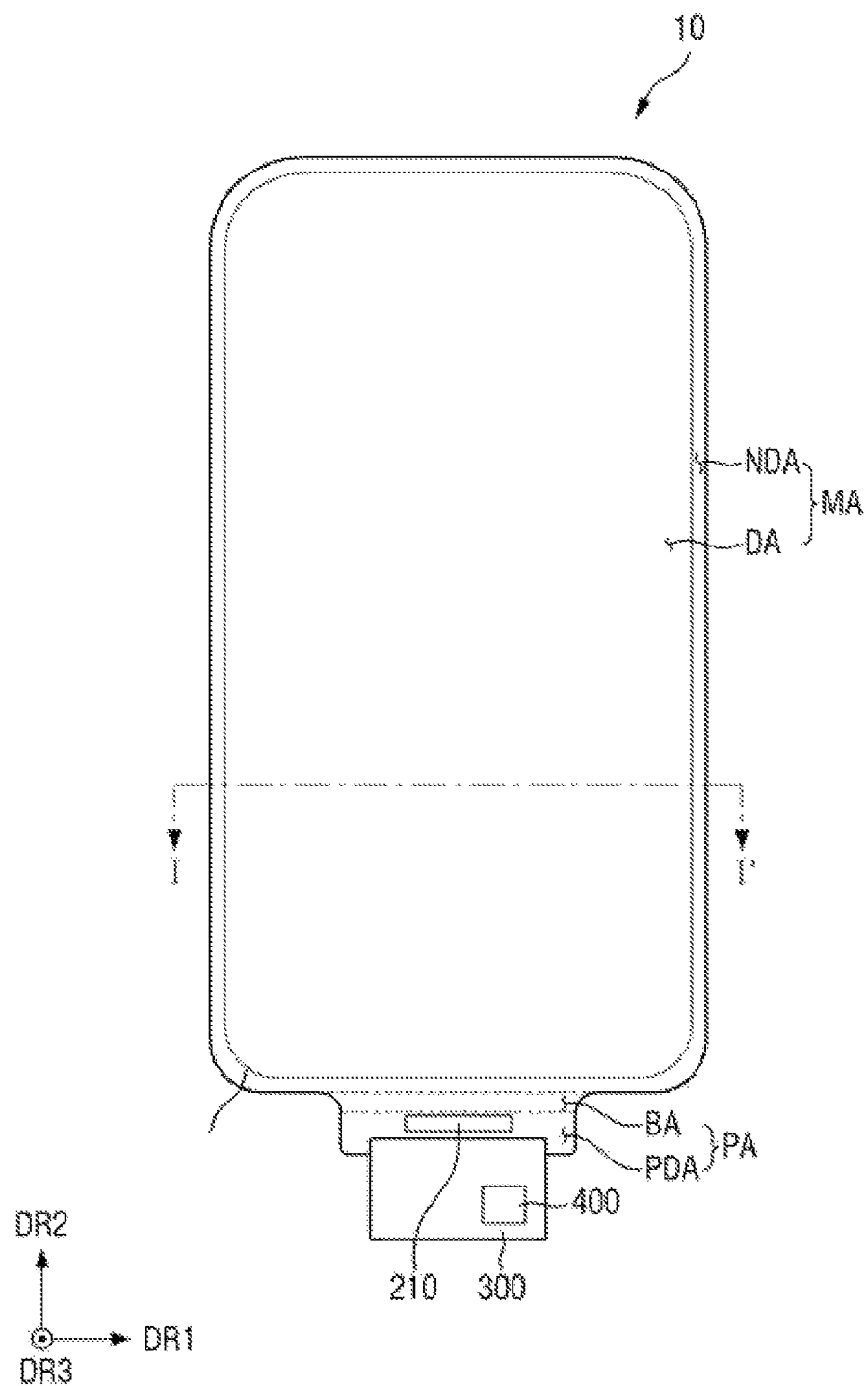
FIG. 1 is a schematic plan view showing a display device according to an embodiment of the disclosure.

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will convey the scope of the invention to those skilled in the art.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other layer, film, region, substrate, or area, or intervening layers, films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

Some of the parts which are not associated with the description may not be provided in order to describe embodiments of the disclosure and like reference numerals refer to like elements throughout the specification.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 80%, 5% of the stated value.

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In the specification and the claims, the phrase "at least one of" is intended to include the meaning of "at least one selected from the group of" for the purpose of its meaning and interpretation. For example, "at least one of A and B" may be understood to mean "A, B, or A and B."

Each of the features of the various embodiments of the disclosure may be combined or combined with each other, in part or in whole, and technically various interlocking and driving are possible. Each embodiment may be implemented independently of each other or may be implemented together in an association.

FIG. 1 is a schematic plan view showing a display device according to an embodiment of the disclosure.

In the specification, the terms "above," "top" and "upper surface" may refer to an upper side of a display device 10 (i.e., the side indicated by the arrow in the third direction DR3), whereas the terms "below," "bottom" and "lower surface" may refer to an opposite side in the third direction DR3. The terms "left," "right," "upper" and "lower" sides may indicate relative positions in case that the display device 10 is viewed from the top. For example, the "right side" may refer to a side indicated by an arrow of a first direction DR1, the "left side" may refer to an opposite side to a side indicated by the arrow of the first direction DR1, the "upper side" may refer to a side indicated by an arrow of a second direction DR2, and the "lower side" may refer to an opposite side to the side indicated by the arrow of the second direction DR2.

Referring to FIG. 1, a display device 10 may display moving images or still images. The display device 10 may be used as a display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultramobile PC (UMPC), a television, a notebook, a monitor, a billboard, Internet of Things (IoT), or the like. The display device 10 may be one of an organic light-emitting display device, a liquid-crystal display device, a plasma display device, a field emission display device, an electrophoretic display device, an electrowetting display device, a quantum dot light-emitting display device, a micro LED display device, or the like. In the following description, the organic light-emitting display device may be described as an example of the display device 10. However, the disclosure is not limited thereto.

According to an embodiment of the disclosure, the display device 10 may include a display panel 100, a display driving circuit 210, a circuit board 300, and a touch driving circuit 400.

The display panel 100 may include a main area MA and a protruding area PA protruding from a side of the main area MA.

The main area MA may be formed in a rectangular plane having shorter sides in the first direction DR1 and longer sides in the second direction DR2 intersecting the first direction DR1. Each of corners where the short side in the first direction DR1 meets the longer side in the second direction DR2 may be rounded with a curvature (e.g., a predetermined or selected curvature) or may have a right angle. The shape of the display device 10 in a plan view may not be limited to a quadrangular shape, but may be formed in a polygonal shape, a circular shape, an elliptical shape, or the like. The main area MA may be flat. However, the disclosure is not limited thereto. The main area MA may include curved portions formed at left and right ends thereof. The curved portions of the main area MA may have a constant curvature or varying curvatures.

The main area MA may include a display area DA where pixels are formed to display images, and a non-display area NDA disposed around the display area DA.

Scan lines SL (e.g., refer to FIG. 3), data lines DL (e.g., refer to FIG. 3), and power lines PL (e.g., refer to FIG. 3) electrically connected to the pixels may further be disposed in the display area DA. In case that the main area MA includes a curved portion, the display area DA may be disposed on the curved portion. Images of the display panel 100 may also be seen on the curved portion.

The non-display area NDA may be defined as an area disposed between an outer side of the display area DA and an edge of the display panel 100. In the non-display area NDA, a scan driver 110 (e.g., refer to FIG. 3) for applying scan signals to scan lines SL (e.g., refer to FIG. 3), and link lines LL (e.g., refer to FIG. 3) electrically connecting the data lines DL (e.g., refer to FIG. 3) with the display driving circuit 210 may be disposed.

The protruding area PA may protrude from a side of the main area MA. For example, the protruding area PA may protrude from a lower side of the main area MA as shown in FIG. 1. A length of the protruding area PA in the first direction DR1 may be smaller than a length of the main area MA in the first direction DR1.

The protruding area PA may include a bending area BA and a pad area PDA. The pad area PDA may be disposed on a side of the bending area BA, and the main area MA may be disposed on an opposite side of the bending area BA. For example, the pad area PDA may be disposed on a lower side of the bending area BA, and the main area MA may be disposed on an upper side of the bending area BA.

The display panel 100 may be formed to be flexible, and may be curved, bent, folded or rolled. Therefore, the display panel 100 may be bent at the bending area BA in the third direction DR3, which is a thickness direction of the display panel 100. A surface of the pad area PDA of the display panel 100 may face an upward direction (e.g., the third direction DR3) before the display panel 100 is bent, and the surface of the pad area PDA of the display panel 100 may face a downward direction (e.g., opposite direction to the third direction DR3) after the display panel 100 is bent. Since the pad area PDA is disposed under the main area MA, the pad area PDA may overlap the main area MA in a plan view.

Pads electrically connected to the display driving circuit 210 and the circuit board 300 may be disposed in the pad area PDA of the display panel 100.

The display driving circuit 210 may output signals and voltages for driving the display panel 100. For example, the display driving circuit 210 may apply data voltages to the data lines DL (e.g., refer to FIG. 3). The display driving circuit 210 may apply a supply voltage (or power voltage) to the power line PL (e.g., refer to FIG. 3) and may apply scan control signals to the scan driver 110 (e.g., refer to FIG. 3). The display driving circuit 210 may be implemented as an integrated circuit (IC) and may be attached to the display panel 100 in the pad area PDA by a chip on glass (COG) technique, a chip on plastic (COP) technique, or an ultrasonic bonding. For example, the display driving circuit 210 may be mounted on the circuit board 300.

Figure 3:
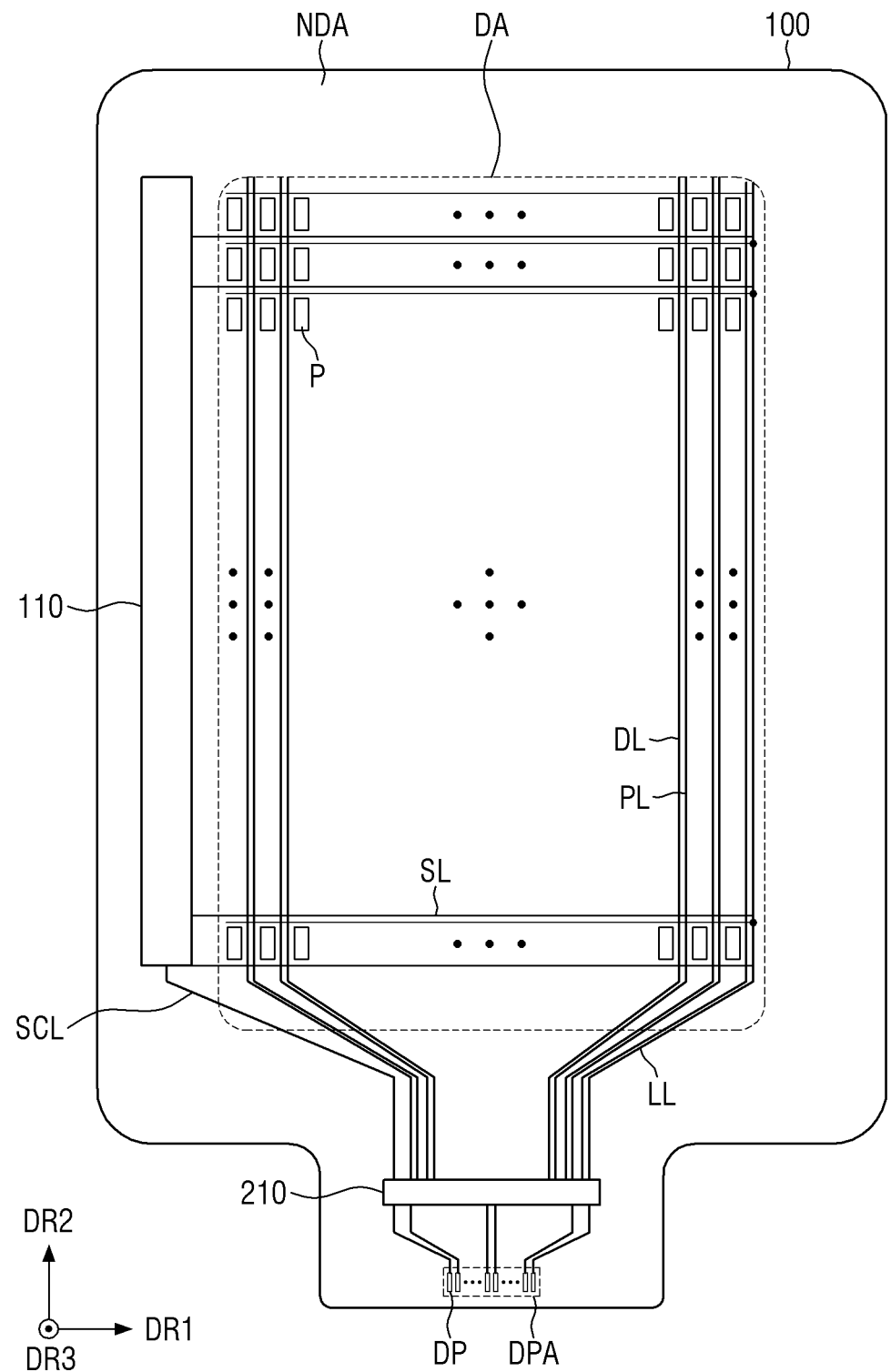
FIG. 3 is a schematic view showing an example of the display part of FIG. 2.
Figure 4:
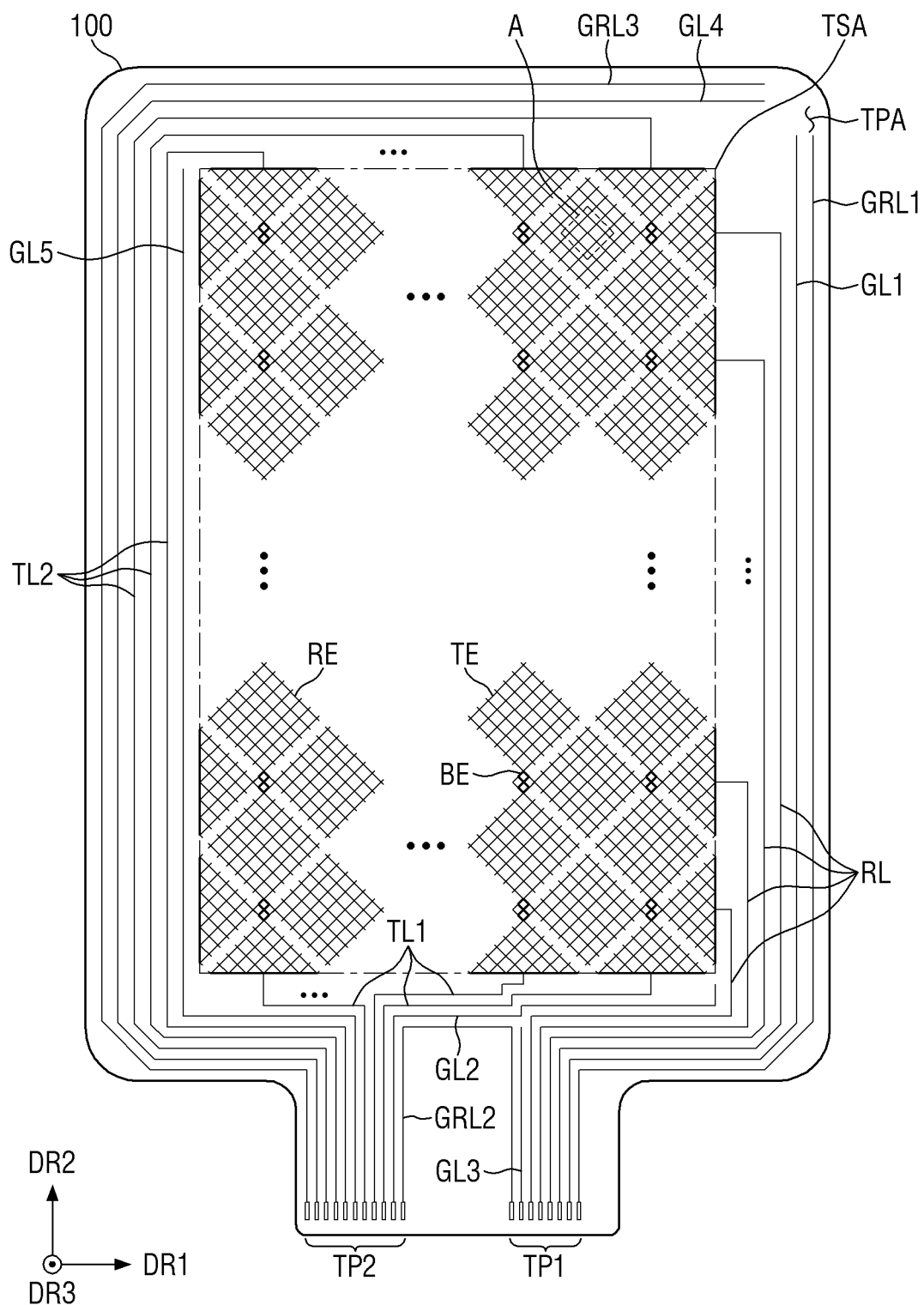
FIG. 4 is a schematic plan view showing an example of the touch detecting part of FIG. 2.

The pads may include display pads DP (e.g., refer to FIG. 3) electrically connected to the display driving circuit 210 and touch pads TP (e.g., refer to FIG. 3) electrically connected to touch lines TL1, TL2, and RL (e.g., refer to FIG. 4).

The circuit board 300 may be attached to the pads using an anisotropic conductive film. Lead lines of the circuit board 300 may be electrically connected to the pads. The circuit board 300 may be a flexible printed circuit board, a printed circuit board, a flexible film such as a chip-on-film, or the like.

The touch driving circuit 400 may be electrically connected to touch electrodes TE and RE (e.g., refer to FIG. 4) of a touch sensor layer TSL (e.g., refer to FIG. 2) of the display panel 100. The touch driving circuit 400 may apply driving signals to the touch electrodes TE and RE (e.g., refer to FIG. 4) of the touch sensor layer TSL (e.g., refer to FIG. 2) and measure capacitances of the touch electrodes TE and RE (e.g., refer to FIG. 4). The driving signals applied by the touch driving circuit 400 may have driving pulses. The touch driving circuit 400 may determine a touch input (e.g., touch event) based on the capacitances, and calculate touch coordinates of the position of the touch input.

The touch driving circuit 400 may be disposed on the circuit board 300. The touch driving circuit 400 may be implemented as an integrated circuit (IC) and may be mounted on the circuit board 300.

Figure 2:
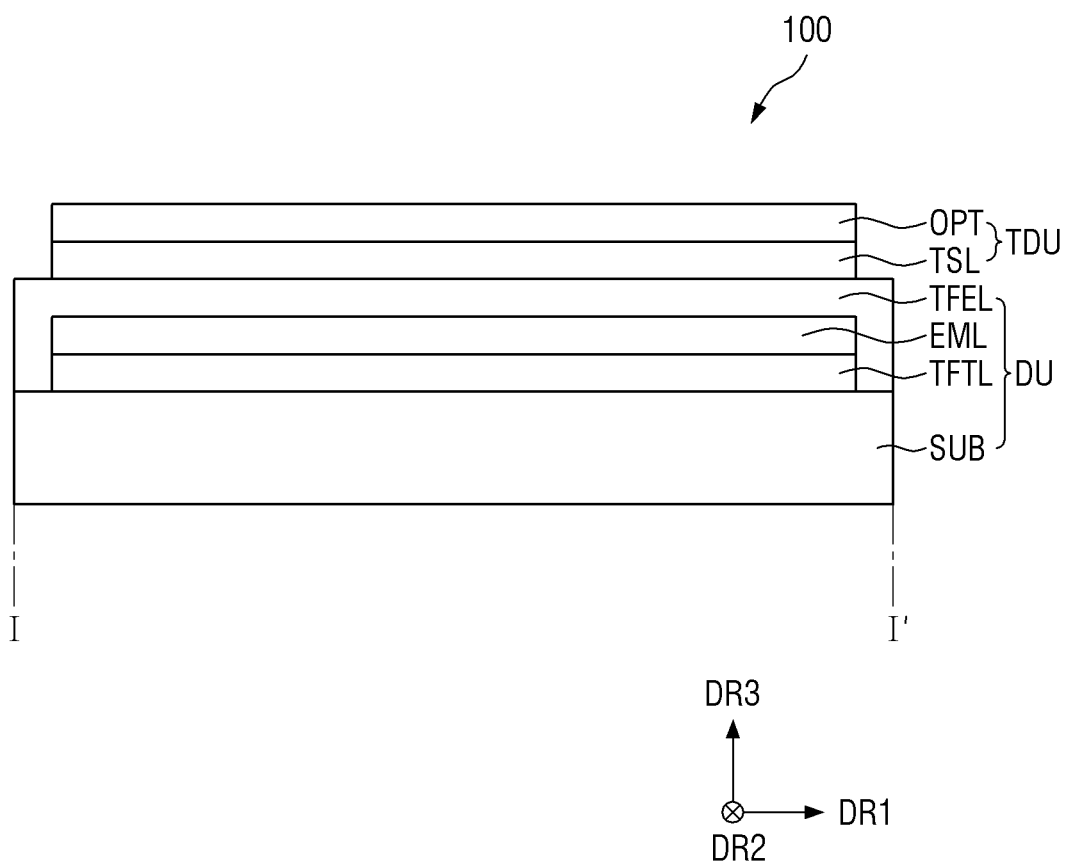
FIG. 2 is a schematic cross-sectional view taken along line I-I' of FIG. 1.

FIG. 2 is a schematic cross-sectional view taken along line I-I' of FIG. 1.

Referring to FIG. 2, the display device 100 may include a display part DU and a touch detecting part TDU. The display part DU may include a substrate SUB, a thin-film transistor layer TFTL disposed on the substrate SUB, an emission layer EML and a thin-film encapsulation layer TFEL. The touch detecting part TDU may include the touch sensor layer TSL and an optical layer OPT.

The substrate SUB may be made of (or include) an insulating material such as glass, quartz a polymer resin, or the like. Examples of the polymer resin (or polymer material) of the substrate SUB may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. In other embodiments, the substrate SUB may include a metallic material.

The substrate SUB may be a rigid substrate or a flexible substrate that may be bent, folded, rolled, and so on. In case that the substrate SUB is the flexible substrate, the substrate SUB may be formed of polyimide (PI). However, the material of the substrate SUB is not limited thereto.

The thin-film transistor layer TFTL may be disposed on the substrate SUB. For example, thin-film transistors disposed in the pixels, scan lines SL (e.g., refer to FIG. 3), data lines DL (e.g., refer to FIG. 3), power supply lines, scan control lines, routing lines connecting the pads with the data lines DL (e.g., refer to FIG. 3) may be formed in the thin-film transistor layer TFTL. Each of the thin-film transistors may include a gate electrode, a semiconductor layer, a source electrode, and a drain electrode. In case that the scan driver 110 is formed in the non-display area NDA of the display panel 100 as shown in FIG. 3, the scan driver 110 may include thin-film transistors.

The thin-film transistor layer TFTL may be disposed in the display area DA and the non-display area NDA. For example, the thin-film transistors in the pixels, the scan lines SL (e.g., refer to FIG. 3), the data lines DL (e.g., refer to FIG. 3), and the power supply lines on the thin-film transistor layer TFTL may be disposed in the display area DA. The scan control lines and the link lines LL (e.g., refer to FIG. 3) on the thin-film transistor layer TFTL may be disposed in the non-display area NDA.

The emission layer EML may be disposed on the thin-film transistor layer TFTL. The emission layer EML may include the pixels and a pixel-defining layer. The pixels may include a first electrode, a light emitting layer, and a second electrode. The light emitting layer may be an organic emissive layer containing an organic material. The light emitting layer may include a hole transporting layer, an organic light-emitting layer, and an electron transporting layer. In case that a voltage (e.g., anode voltage) is applied to the first electrode and a cathode voltage is applied to the second electrode through the thin-film transistor on the thin-film transistor layer TFTL, holes and electrons move to the organic light-emitting layer through the hole transporting layer and the electron transporting layer, respectively. Thus, the holes and the electrons combine each other in the organic light-emitting layer to emit light. The pixels on the emission layer EML may be disposed in the display area DA.

The thin-film encapsulation layer TFEL may be disposed on the emission layer EML. The thin-film encapsulation layer TFEL may prevent oxygen or moisture from permeating into the emission layer EML. Thus, the thin-film encapsulation layer TFEL may include at least one inorganic layer. The inorganic film may include at least one of silicon oxide ($SiN_x$), silicon oxynitride ($SiN_xO_y$), silicon oxide ($SiO_x$), titanium oxide ($TiO_2$), and aluminum oxide ($Al_2O_3$). However, the thin-film encapsulation layer TFEL is not limited thereto. The thin-film encapsulation layer TFEL may protect the emission layer EML from foreign substances such as dust. Thus, the thin-film encapsulation layer TFEL may include at least one organic layer. The organic layer may be formed of at least one material of an acryl resin, an epoxy resin, a phenolic resin, a polyamide resin and a polyimide resin. However, the organic layer is not limited thereto.

The thin-film encapsulation layer TFEL may be disposed in the display area DA and the non-display area NDA. For example, the thin-film encapsulation layer TFEL may cover (or overlap in a plan view) the display area DA and the emission layer EML. The thin-film encapsulation layer TFEL may cover the thin-film transistor layer TFTL in the non-display area NDA.

The touch sensor layer TSL may be disposed on the thin-film encapsulation layer TFEL. As the touch sensor layer TSL is disposed directly on the thin-film encapsulation layer TFEL, a thickness of the display device 10 may be reduced, compared with a display device in which a separate touch panel including the touch sensor layer TSL is attached on the thin-film encapsulation layer TFEL.

The touch sensor layer TSL may include touch electrodes TE and RE (e.g., refer to FIG. 4) for sensing a user's touch (or touch event) by capacitive sensing, and touch lines TL1, TL2, and RL (e.g., refer to FIG. 4) for connecting the pads with the touch electrodes TE and RE (e.g., refer to FIG. 4). For example, the touch sensor layer TSL may sense a user's touch (or touch event) by self-capacitance sensing or mutual capacitance sensing.

The touch electrodes TE and RE (e.g., refer to FIG. 4) of the touch sensor layer TSL may be disposed in a touch sensor area TSA overlapping the display area DA in a plan view as shown in FIG. 4. The touch lines TL1, TL2, and RL (e.g., refer to FIG. 4) of the touch sensor layer TSL may be disposed in a touch peripheral area TPA overlapping the non-display area NDA in a plan view as shown in FIG. 4.

The optical layer OPT may be disposed on the touch sensor layer TSL. The optical layer OPT may reflect (e.g., totally reflect) light which is emitted from the emission layer EML and travel toward a side surface rather than in the third direction DR3 of the display panel 100. Thus, the light may travel in the third direction DR3 of the display panel 100. Although the optical layer OPT is formed on the touch sensor layer TSL as a separate layer in FIG. 4, the disclosure is not limited thereto. For example, the touch sensor layer TSL and the optical layer OPT may be formed as a single layer.

A polarizing plate (not illustrated) and a cover window (not illustrated) may be further disposed on the optical layer OPT. The optical layer OPT and the polarizing plate (not illustrated) may be attached together by a transparent adhesive member (not illustrated) such as an optically clear adhesive (OCA) film.

FIG. 3 is a schematic view showing an example of the display part of FIG. 2 in detail.

For convenience of illustration, FIG. 3 shows only pixels P, scan lines SL, data lines DL, a power line PL, scan control lines SCL, a scan driver 110, a display driving circuit 210, and display pads DP of the display part DU. However, the disclosure is not limited thereto.

Referring to FIG. 3, the scan lines SL, the data lines DL, the power line PL, and the pixels P may be disposed in the display area DA. The scan lines SL may be arranged in the first direction DR1, and the data lines DTL may be arranged in the second direction DR2 intersecting the first direction DR1. The power line PL may include at least one line parallel with the data lines DL in the second direction DR2, and lines branching off (or branched) from the at least one line in the first direction DR1.

Each of the pixels P may be electrically connected to at least one of the scan lines SL, one of the data lines DL, and the power line PL. Each of the pixels P may include thin-film transistors, an organic light-emitting diode, and a capacitor. The thin-film transistors of each of the pixels P may include a driving transistor and at least one switching transistor. In case that the scan signal is applied from the scan line SL, each of the pixels P may receive a data voltage of the data line DL and supply a driving current to the organic light-emitting diode according to the data voltage applied to the gate electrode. Thus, light is emitted from the light-emitting diode.

The scan driver 110 may be electrically connected to the display driving circuit 210 through at least one scan control line SCL. Accordingly, the scan driver 110 may receive the scan control signal of the display driving circuit 210. The scan driver 110 may generate the scan signals according to a scan control signal and supplies the scan signals to the scan lines SL.

Although the scan driver 110 is formed in the non-display area NDA on a left side of the display area DA in FIG. 3, the disclosure is not limited thereto. For example, the scan driver 110 may be formed in the non-display area NDA on the left outer side of the display area DA and formed in the non-display area NDA adjacent to a right outer side of the display area DA.

The display driving circuit 210 may be electrically connected to the display pads DP and receive digital video data and timing signals. The display driving circuit 210 may convert the digital video data into analog positive/negative data voltages and supply the converted analog positive/negative data voltages to the data lines DL through the link lines LL. The display driving circuit 210 may generate and supply the scan control signal for controlling the scan driver 110 through the scan control line SCL. The pixels P to which the data voltages are supplied are selected by the scan signals of the scan driver 110, and the data voltages are supplied to the selected pixels P. The display driving circuit 210 may be implemented as an integrated circuit (IC) and may be attached to the substrate SUB by a chip on glass (COG) technique, a chip on plastic (COP) technique, or an ultrasonic bonding.

FIG. 4 is a schematic plan view showing an example of the touch detecting part of FIG. 2.

For convenience of illustration, FIG. 4 shows only the touch electrodes TE and RE, the touch lines TL1, TL2, and RL, and the touch pads TP.

Referring to FIG. 4, the touch detecting part TDU may include a touch sensor area TSA for detecting a user's touch (e.g., touch event), and a touch peripheral area TPA disposed around the touch sensor area TSA. The touch sensor area TSA may overlap the display area DA of the display panel 100, and the touch peripheral area TPA may overlap the non-display area NDA of the display part DU in a plan view.

The touch electrodes TE and RE may be disposed in the touch sensor area TSA. The touch electrodes TE and RE may include sensing electrodes RE electrically connected with one another in the first direction DR1, and driving electrodes TE electrically connected with one another in the second direction DR2 intersecting the first direction DR1. Although the sensing electrodes RE and the driving electrodes TE are formed in a diamond-like shape in a plan view in FIG. 4, the disclosure is not limited thereto.

In order to prevent a short-circuit from being created between the sensing electrodes RE and the driving electrodes TE in a crossing region in which the sensing electrodes RE and the driving electrodes TE cross each other, the driving electrodes TE adjacent to each other in the second direction DR2 may be electrically connected to each other via connection electrodes BE. The driving electrodes TE and the sensing electrodes RE may be disposed on a layer (e.g., same layer), and the connection electrodes BE may be disposed on a different layer from the driving electrodes TE and the sensing electrodes RE. The sensing electrodes RE electrically connected with one another in the first direction DR1, and the driving electrodes TE electrically connected with one another in the second direction DR2 may be electrically insulated from one another. For example, the sensing electrodes RE electrically connected with one another in the first direction DR1 may be electrically insulated from the driving electrodes TE electrically connected with one another in the second direction DR2.

The touch lines TL1, TL2, and RL may be disposed in the touch peripheral area TPA. The touch lines TL1, TL2, and RL may include first driving lines TL1, second driving lines TL2. The sensing lines RL may be electrically connected to the sensing electrodes RE, and the first driving lines TL1 and the second driving lines TL2 may be electrically connected to the driving electrodes TE.

The sensing electrodes RE disposed on a right side of the touch sensor area TSA may be electrically connected to the sensing lines RL. For example, some of the sensing electrodes RE electrically connected in the first direction DR1, which are disposed at the right end, may be electrically connected to the sensing lines RL. The sensing lines RL may be electrically connected to first touch pads TP1. Thus, the touch driving circuit 400 may be electrically connected to the sensing electrodes RE.

The driving electrodes TE disposed on a lower side of the touch sensor area TSA may be electrically connected to the first driving lines TL1, and the driving electrodes TE disposed on an upper side of the touch sensor area TSA may be electrically connected to the second driving lines TL2. For example, some of the driving electrodes TE electrically connected to one another in the second direction DR2 on a lower end (e.g., lower end of touch sensor area TSA) may be electrically connected to the first driving lines TL1, and some of the driving electrodes TE disposed on the upper end may be electrically connected to the second driving lines TL2. The second driving lines TL2 may be electrically connected to the driving electrodes TE on the upper side of the touch sensor area TSA via a left outer side of the touch sensor area TSA. The first driving lines TL1 and the second driving lines TL2 may be electrically connected to the second touch pads TP2. Thus, the touch driving circuit 400 may be electrically connected to the driving electrodes TE.

The touch electrodes TE and RE may be driven in a self-capacitance sensing scheme or a mutual-capacitance sensing scheme. In case that the touch electrodes TE and RE are driven in the mutual-capacitance sensing scheme, the driving signals may be supplied to the driving electrodes TE through the first driving lines TL1 and the second driving lines TL2. Thus, the mutual capacitances formed at the intersections between the sensing electrodes RE and the driving electrodes TE may be charged. Changes in the amount of the charges of the sensing electrodes RE are measured through the sensing lines RL, and the touch input may be determined according to the changes in the amount of the charges of the sensing electrodes RE. The driving signals may have driving pulses.

In case that the touch electrodes TE and RE are driven in the self-capacitance sensing scheme, the driving signals may be supplied to the driving electrodes TE and the sensing electrodes RE through the first driving lines TL1, the second driving lines TL2, and the sensing lines RL. Thus, the self-capacitances of the driving electrodes TE and the sensing electrodes RE may be charged. Changes in the amount of the charges of the self-capacitances of the driving electrodes TE and the sensing electrodes RE may be measured through the first driving lines TL1, the second driving lines TL2, and the sensing lines RL, and the touch input may be determined based on the changes in the amount of the charges of the self-capacitances.

The driving electrodes TE, the sensing electrodes RE, and the connection electrodes BE may be formed as mesh-shaped electrodes as shown in FIG. 4. In case that the touch sensor layer TSL including the driving electrodes TE and the sensing electrodes RE is formed directly on the thin-film encapsulation layer TFEL as shown in FIG. 2, a distance between the second electrode of the emission layer EML and the driving electrodes TE or the sensing electrodes RE of the touch sensor layer TSL may be small. Thus, a large parasitic capacitance may be formed between the second electrode of the emission layer EML and the driving electrodes TE or the sensing electrodes RE of the touch sensor layer TSL. In order to reduce the parasitic capacitance, the driving electrodes TE and the sensing electrodes RE may be formed as the mesh-shaped pattern as shown in FIG. 4, and may not be formed as non-patterned electrodes of a transparent oxide conductive layer such as ITO and IZO.

A first guard line GL1 may be disposed on an outer side of the outermost one of the sensing lines RL. A first ground line GRL1 may be disposed on an outer side of the first guard line GL1. The first guard line GL1 may be disposed on a right side of the rightmost one of the sensing lines, and the first ground line GRL1 may be disposed on a right side of the first guard line GL1.

A second guard line GL2 may be disposed between the innermost one of the sensing lines RL and the first driving line TL1 which is the rightmost one of the first driving lines TL1. The second guard line GL2 may be disposed between the rightmost one of the first driving lines TL1 and the second ground line GRL2. Furthermore, a third guard line GL3 may be disposed between the innermost one of the sensing lines RL and the second ground line GRL2. The second ground line GRL2 may be electrically connected to the leftmost one of the first touch pads TP1 and the rightmost one of the second touch pads TP2.

A fourth guard line GL4 may be disposed on an outer side of the outermost one of the second driving lines TL2. The third ground line GRL3 may be disposed on an outer side of the fourth guard line GL4. For example, the fourth guard line GL4 may be disposed on left and upper sides of the leftmost and the uppermost one of the second driving lines TL2. The third ground line GRL3 may be disposed on left and the upper sides of the fourth guard line GL4.

A fifth guard line GL5 may be disposed on an inner side of the innermost one of the second driving lines TL2. For example, the fifth guard line GL5 may be disposed between the rightmost one of the second driving lines TL2 and the touch electrodes TE and RE.

According to the embodiment of the disclosure shown in FIG. 4, the first ground line GRL1, the second ground line GRL2, and the third ground line GRL3 may be disposed on the uppermost side, the leftmost side, and the rightmost side of the display panel 100, respectively. A ground voltage may be applied to the first ground line GRL1, the second ground line GRL2, and the third ground line GRL3. Accordingly, in case that static electricity is applied from the outside, the static electricity may be discharged to the first ground line GRL1, the second ground line GRL2, and the third ground line GRL3.

According to the embodiment of the disclosure shown in FIG. 4, the first guard line GL1 may be disposed between the outermost one of the sensing lines RL and the first ground line GRL1, and the first guard line GL1 may reduce the influence by a change in the voltage of the first ground line GRL1 on the outermost one of the sensing lines RL. For example, the outermost one of the sensing lines RL may not be influenced by the voltage change of the first ground line GRL1 by the first guard line GL1. The second guard line GL2 may be disposed between the innermost one of the sensing lines RL and the outermost one of the first driving line TL1. Therefore, the second guard line GL2 may reduce the influence by a change in the voltage on the innermost one of the sensing lines RL and on the outermost one of the first driving lines TL1. For example, the innermost one of the sensing lines RL and the outermost one of the first driving lines TL1 may not be influenced by the voltage change by the second guard line GL2. The third guard line GL3 may be disposed between the innermost one of the sensing lines RL and the second ground line GRL2, and the third guard line GL3 may reduce the influence by a change in the voltage of the second ground line GRL2 on the innermost one of the sensing lines RL. For example, the innermost one of the sensing lines RL may not be influenced by the voltage change of the second ground line GRL2 by the third guard line GL3. The fourth guard line GL4 may be disposed between the outermost one of the second sensing lines TL2 and the third ground line GRL3, and the fourth guard line GL4 may reduce the influence by a change in the voltage of the third ground line GRL3 on the second driving line TL2. For example, the second driving line TL2 may not be influenced by the voltage change of the third ground line GRL3 by the fourth guard line GL4. The fifth guard line GL5 may be disposed between the innermost one of the second driving lines TL2 and the touch electrodes TE and RE, and the fifth guard line GL5 may reduce mutual influence between the innermost one of the second driving lines TL2 and the touch electrodes TE and RE.

In case that the touch electrodes TE and RE are driven by mutual-capacitance sensing scheme, a ground voltage may be applied to the first guard line GL1, the second guard line GL2, the third guard line GL3, the fourth guard line GL4, and the fifth guard line GL5. In case that the touch electrodes TE and RE are driven by the self-capacitance sensing scheme, the same driving signals as the driving signals applied to the first driving lines TL1, the second driving lines TL2, and the sensing lines RL may be applied to the first guard line GL1, the second guard line GL2, the third guard line GL3, the fourth guard line GL4, and the fifth guard line GL5.

Figure 5:
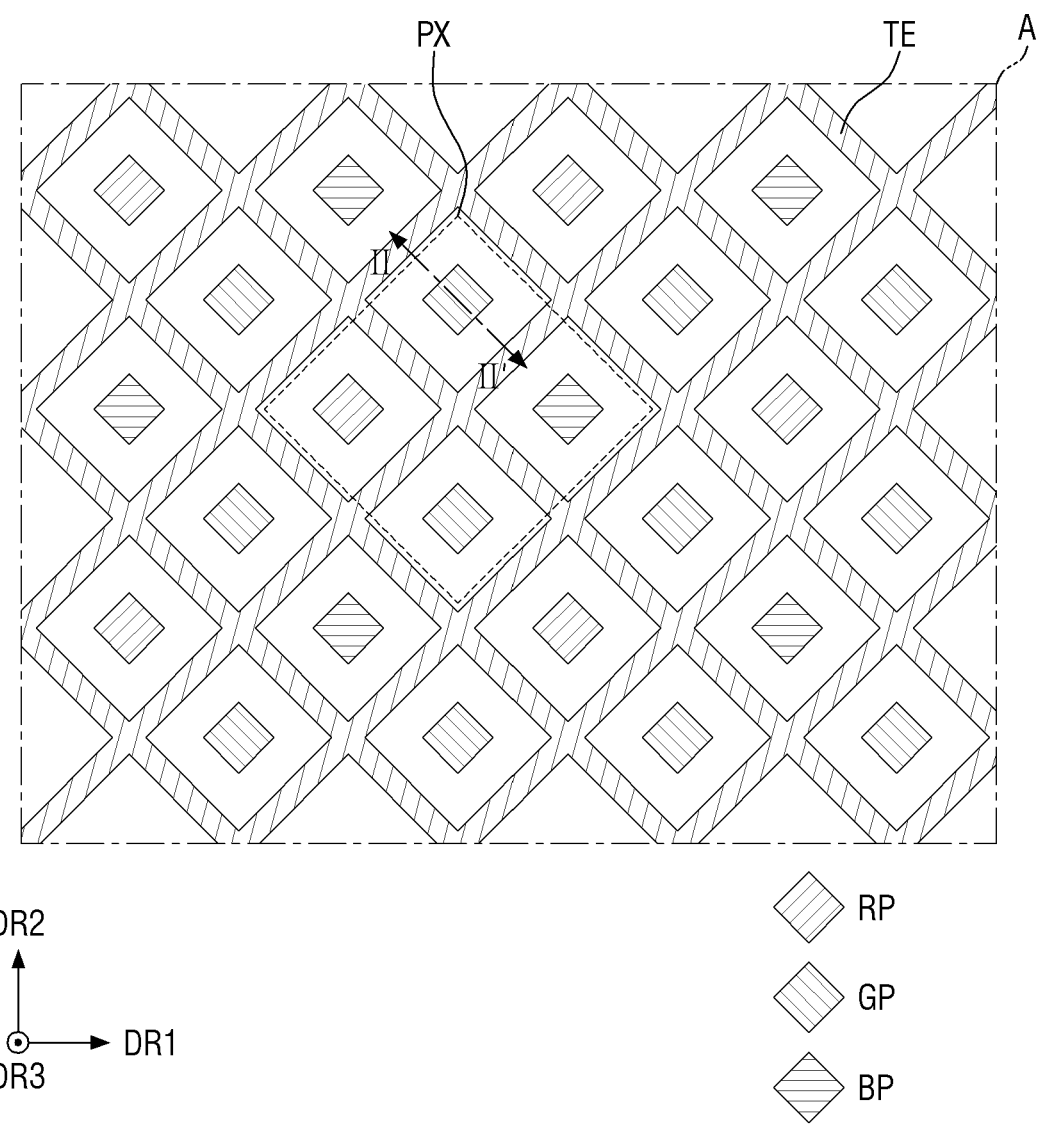
FIG. 5 is a schematic enlarged plan view of area A of FIG. 4.

FIG. 5 is a schematic enlarged plan view of area A of FIG. 4.

FIG. 5 shows an example of the sub-pixels of FIG. 3 and the first touch metal layer of FIG. 4.

Referring to FIG. 5, the sub-pixels may include first sub-pixels RP, second sub-pixels GP, and third sub-pixels BP. Each of the first sub-pixels RP may represent (or display) a first color. Each of the second sub-pixels GP may represent (or display) a second color. Each of the third sub-pixels BP may represent (or display) a third color. The first color may be red. The second color may be green. The third color may be blue. However, the disclosure is not limited thereto.

In the display panel 100, each of the pixels P may represent (or display) a white grayscale. One first sub-pixel RP, two second sub-pixels GP and one third sub-pixel BP may be defined as one pixel PX. A first sub-pixel RP, second sub-pixels GP and a third sub-pixel BP, which are defined as a single pixel PX, may be arranged in a diamond shape as shown in FIG. 5.

The number of the first sub-pixels RP may be equal to the number of the third sub-pixels BP in the display panel 100. The number of the second sub-pixels GP in the display panel 100 may be equal to twice the number of the first sub-pixels RP, and may be equal to twice the number of the third sub-pixels BP. In the display panel 100, the number of the second sub-pixels GP may be equal to the sum of the number of the first sub-pixels RP and the number of the third sub-pixels BP.

In FIG. 5, the first sub-pixels RP, the second sub-pixels GP, and the third sub-pixels BP may be formed in a diamond shape in a plan view. However, the disclosure is not limited thereto. The first sub-pixels RP, the second sub-pixels GP, and the third sub-pixels BP may be formed in a rectangular or square shape in a plan view, or may be formed in any other polygonal shape, a circular shape, or an elliptic shape other than a quadrangular shape. The first sub-pixels RP, the second sub-pixels GP, and the third sub-pixels BP may have different shapes. For example, the first sub-pixels RP may have a different shape from that of the second sub-pixels GP or the third sub-pixels BP, and the second sub-pixels GP may have a different shape from that of the first sub-pixels RP or the third sub-pixels BP.

In FIG. 5, the first sub-pixels RP, the second sub-pixels GP, and the third sub-pixels BP have a same size in a plan view. However, the disclosure is not limited thereto. The first sub-pixels RP, the second sub-pixels GP, and the third sub-pixels BP may have different sizes in a plan view. For example, in a plan view, the size of the first sub-pixels RP may be larger than the size of the second sub-pixels GP, and the size of the third sub-pixels BP may be larger than the size of the second sub-pixels GP. In a plan view, the size of the first sub-pixels RP may be substantially equal to or smaller than the size of the third sub-pixels BP.

The driving electrodes TE may surround the first sub-pixels RP, the second sub-pixels GP, and the third sub-pixels BP in a plan view. The driving electrodes TE may be formed in a mesh shape and disposed between the sub pixels RP, GP, and BP. Thus, it possible to prevent the emission area of each of the sub-pixels RP, GP, and BP from being reduced due to the driving electrodes TE. For example, the emission area of each of the sub-pixels RP, GP, and BP may not be reduced by the driving electrodes TE. Since the overlapping area between the driving electrode TE and the second electrode 173 (e.g., refer to FIG. 6) is reduced, a parasitic capacitance between the driving electrodes TE and the second electrode 173 (e.g., refer to FIG. 6) may be reduced. The sensing electrodes RE and the driving electrodes TE may be formed on a same layer. Thus, detailed description of the sensing electrode RE is omitted.

Figure 6:
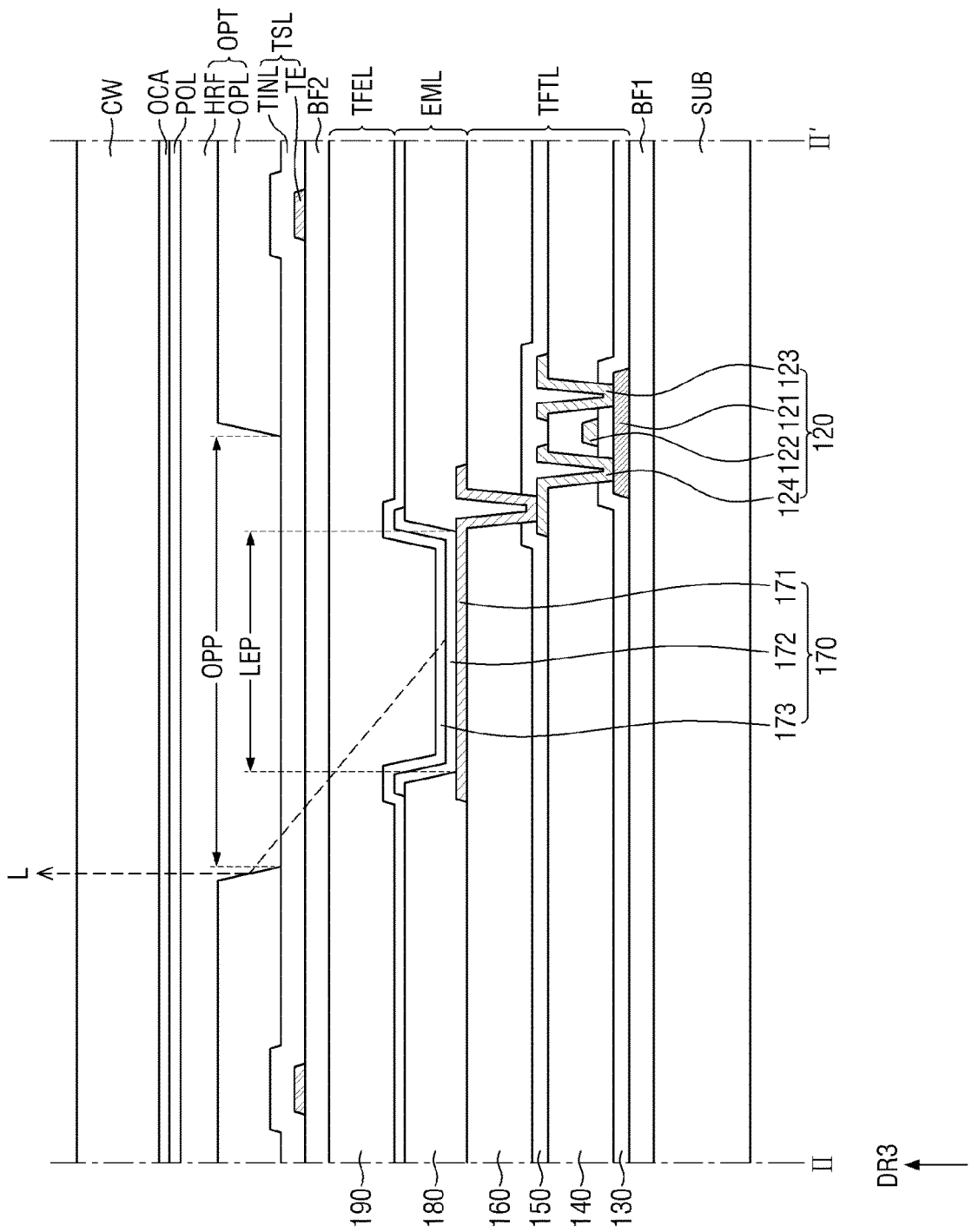
FIG. 6 is a schematic cross-sectional view taken along line II-II' of FIG. 5.

FIG. 6 is a schematic cross-sectional view taken along line II-II' of FIG. 5.

Referring to FIG. 6, the thin-film transistor layer TFTL may be disposed on the substrate SUB. The thin-film transistor layer TFTL may include thin-film transistors 120, a gate insulating layer 130, an interlayer dielectric layer 140, a protective layer 150, and a planarization layer 160.

For example, a first buffer layer BF1 may be disposed on a surface of the substrate SUB. The first buffer layer BF1 may be formed on the surface of the substrate SUB and protect the thin-film transistors 120 and an organic emitting layer 172 of the emission layer EML from moisture that is likely to permeate through the substrate SUB. The first buffer layer BF1 may be made up of (or include) multiple inorganic layers alternately stacked on one another. For example, the first buffer layer BF1 may be formed as a stack of multiple layers in which one or more inorganic layers are stacked on one another alternately. For example, the multiple layers of the first buffer layer BF1 may include at least one of silicon oxide ($SiN_x$), silicon oxynitride ($SiN_xO_y$), silicon oxide ($SiO_x$), titanium oxide ($TiO_2$), and aluminum oxide ($Al_2O_3$). However, the first buffer layer BF1 may be omitted.

The thin-film transistor 120 may be disposed on the first buffer layer BF1. Each of the thin-film transistors 120 may include an activate layer 121, a gate electrode 122, a source electrode 123, and a drain electrode 124. In FIG. 6, the thin-film transistor 120 is implemented as a top-gate transistor in which the gate electrode 122 is located above the active layer 121. However, the disclosure is not limited thereto. The thin-film transistor 120 may be implemented as bottom-gate transistors in which the gate electrode 122 is located below the active layer 121, or as double-gate transistors in which the gate electrodes 122 are disposed above and below the active layer 121.

The active layer 121 may be disposed on the first buffer layer BF1. The active layer 121 may include at least one of polycrystalline silicon, single crystal silicon, low-temperature polycrystalline silicon, amorphous silicon, or an oxide semiconductor. The oxide semiconductor layer of the active layer 121 may include, for example, a binary compound (ABx), a ternary compound (ABxCy) and a quaternary compound (ABxCyDz) containing indium (In), zinc (Zn), gallium (Ga), tin (Sn), titanium (Ti), aluminum (Al), hafnium (Hf), zirconium (Zr), and magnesium (Mg). The active layer 121 may include other suitable oxide semiconductors. For example, the active layer 121 may include an oxide including at least one of indium, tin, and zinc (ITZO), or an oxide including at least one of indium, gallium, and zinc (IGZO). However, the disclosure is not limited thereto. A light-blocking layer (not illustrated) for blocking external light incident on the active layer 121 may be further disposed between the first buffer layer BF1 and the active layer 121.

The gate insulating layer 130 may be disposed on the active layer 121. The gate insulating layer 130 may include at least one of silicon oxide ($SiN_x$), silicon oxynitride ($SiN_xO_y$), silicon oxide ($SiO_x$), titanium oxide ($TiO_2$), and aluminum oxide ($Al_2O_3$).

The gate electrode 122 may be disposed on the gate insulating layer 130. The gate electrode 122 may be made up of (or include) a single layer or multiple layers including at least one of molybdenum (Mo), aluminum (Al), chromium (Cr), gold (Au), titanium (Ti), nickel (Ni), neodymium (Nd), copper (Cu), and an alloy thereof. Although not shown in the drawings, a gate line and the gate electrode 122 may be disposed on a same layer.

The interlayer dielectric layer 140 may be disposed on the gate electrode 122. The interlayer dielectric layer 140 may include at least one of silicon oxide ($SiN_x$), silicon oxynitride ($SiN_xO_y$), silicon oxide ($SiO_x$), titanium oxide ($TiO_2$), and aluminum oxide ($Al_2O_3$).

The source electrode 123 and the drain electrode 124 may be disposed on the interlayer dielectric layer 140. Each of the source electrode 123 and the drain electrode 124 may be electrically connected to the active layer 121 through contact holes penetrating through the gate insulating layer 130 and the interlayer dielectric layer 140. Each of the source electrode 123 and the drain electrode may be made up of (or include) a single layer or multiple layers including at least one of molybdenum (Mo), aluminum (Al), chromium (Cr), gold (Au), titanium (Ti), nickel (Ni), neodymium (Nd), copper (Cu), and an alloy thereof.

The protective layer 150 may be formed on the source electrode 123 and the drain electrode 124, and electrically insulate the thin-film transistors 120. The protective layer 150 may include at least one of silicon oxide ($SiN_x$), silicon oxynitride ($SiN_xO_y$), silicon oxide ($SiO_x$), titanium oxide ($TiO_2$), and aluminum oxide ($Al_2O_3$).

The planarization layer 160 may be formed on the protective layer 150, and provide a flat surface over step differences (or height or thickness differences) of the thin-film transistor 120. The planarization layer 160 may include at least one of an acryl resin, an epoxy resin, a phenolic resin, a polyamide resin, a polyimide resin, etc.

The emission layer EML may be disposed on the thin-film transistor layer TFTL. The emission layer EML may include a light-emitting element 170 and a pixel-defining layer 180.

The light-emitting element 170 and the pixel-defining layer 180 may be disposed on the planarization layer 160. The light-emitting element 170 may include a first electrode 171, the organic emitting layer 172, and the second electrode 173.

The first electrode 171 may be disposed (e.g., directly disposed) on the planarization layer 160. The first electrode 171 may be electrically connected to the source electrode 123 of the thin-film transistor 120 through a contact hole penetrating through the protective layer 150 and the planarization layer 160.

In the top-emission organic light-emitting diode, the light emitted from the organic emitting layer 172 may exit toward the second electrode 173. The first electrode 171 may be made of (or include) a metallic material having a high reflectivity, and include a stack structure (e.g., triple layers) of aluminum and titanium (Ti/Al/Ti), a stack structure (e.g., triple layers) of aluminum and ITO (ITO/Al/ITO), a single layer of an APC alloy, a stack structure (e.g., triple layers) of APC alloy and ITO (ITO/APC/ITO), or other suitable structures. The APC alloy may be an alloy of silver (Ag), palladium (Pd), and copper (Cu).

In the bottom-emission organic light-emitting diode, the light emitted from the organic emitting layer 172 may exit toward the first electrode 173. The first electrode 171 may be formed of (or include) a transparent conductive material (TCP) such as ITO and IZO that may transmit light, or a semi-transmissive conductive material such as magnesium (Mg), silver (Ag), and an alloy of magnesium (Mg) and silver (Ag). In case that the first electrode 171 is formed of the semi-transmissive conductive material, the light extraction efficiency may be increased by using microcavities (not illustrated).

The pixel-defining layer 180 may separate the first electrode 171 from one another on the planarization layer 160, and define the sub-pixels RP, GP, and BP. The pixel-defining layer 180 may cover an edge of the first electrode 171. The pixel-defining layer 180 may be formed of an organic layer including at least one of an acryl resin, an epoxy resin, a phenolic resin, a polyamide resin, and a polyimide resin.

In each of the sub-pixels RP, GP, and BP, the first electrode 171, the organic emitting layer 172, and the second electrode 173 may be stacked on one another sequentially. Thus, holes from the first electrode 171 and electrons from the second electrode 173 may be combined with each other in the organic emitting layer 172, and emit light. t. Each of the sub-pixels RP, GP, and BP may include the light-emitting element 170.

The organic emitting layer 172 may be disposed on the first electrode 171 and the pixel-defining layer 180. The organic emitting layer 172 may include an organic material and emit light of a color (e.g., particular color). For example, the organic emitting layer 172 may include a hole transporting layer (not illustrated), an organic layer (not illustrated), and an electron transporting layer (not illustrated). The organic emitting layer 172 of the first sub-pixel RP may emit light of the first color. The organic emitting layer 172 of the second sub-pixel GP may emit light of the second color. The organic emitting layer 172 of the third sub-pixel BP may emit light of the third light. The first color may be red. The second color may be green. The third color may be blue. However, the disclosure is not limited thereto.

In other embodiments, the organic emitting layer 172 of each of the sub-pixels RP, GP, and BP may emit white light. The first sub-pixel RP may emit light of the first color through a color filter that transmits the light of the first color. The second sub-pixel GP may emit light of the second color through a color filter that transmits the light of the second color. The third sub-pixel BP may emit light of the third color through a color filter that transmits the light of the third color.

The second electrode 173 may be disposed on the organic emitting layer 172. The second electrode 173 may cover the organic emitting layer 172. The second electrode 173 may be a common layer formed across the sub-pixels RP, GP, and BP.

In the top-emission organic light-emitting diode, the second electrode 173 may be formed of a transparent conductive material (TCP) such as ITO and IZO that may transmit light, or a semi-transmissive conductive material such as magnesium (Mg), silver (Ag) and an alloy of magnesium (Mg) and silver (Ag). In case that the second electrode 173 is formed of a semi-transmissive conductive material, the light extraction efficiency may be increased by using microcavities.

In the bottom-emission organic light-emitting diode, the second electrode 173 may be made of (or include) a metallic material having a high reflectivity, and include a single layer of aluminum, a stack structure (e.g., triple layers) of aluminum and titanium (Ti/Al/Ti), a stack structure (e.g., triple layers) of aluminum and ITO (ITO/Al/ITO), a single layer of an APC alloy, a stack structure (e.g., triple layers) of APC alloy and ITO (ITO/APC/ITO), or other suitable structures. The APC alloy may be an alloy of silver (Ag), palladium (Pd) and copper (Cu).

The thin-film encapsulation layer TFEL may be disposed on the emission layer EML. The thin-film encapsulation layer TFEL may include an encapsulation layer 190.

The encapsulation layer 190 may be disposed on the second electrode 173. The encapsulation layer 190 may include at least one inorganic layer, and prevent oxygen or moisture from permeating into the organic emitting layer 172 and the second electrode 173. The encapsulation layer 190 may include at least one organic layer, and protect the emission layer EML from particles such as dust. For example, the encapsulation layer 190 may include a first inorganic layer disposed on the second electrode 173, an organic layer disposed on the first inorganic layer, and a second inorganic layer disposed on the organic layer. The first inorganic layer and the second inorganic layer may include at least one of silicon oxide ($SiN_x$), silicon oxynitride ($SiN_xO_y$), silicon oxide ($SiO_x$), titanium oxide ($TiO_2$), and aluminum oxide ($Al_2O_3$). However, the disclosure is not limited thereto, and the first inorganic layer (not illustrated) and the second inorganic layer (not illustrated) of the encapsulation layer 190 may include other suitable insulating materials. The organic layer of the encapsulation layer 190 may include at least one of an acryl resin, an epoxy resin, a phenolic resin, a polyamide resin, and a polyimide resin. However, the disclosure is not limited thereto, and the organic layer of the encapsulation layer 190 may include other suitable organic materials.

A second buffer layer BF2 may be disposed on the encapsulation layer TFEL. The second buffer layer BF2 may be made up of (or include) multiple inorganic layers sequentially stacked on one another. For example, the second buffer layer BF2 may be formed as a stack of multiple layers in which one or more inorganic layers are stacked one another alternately. For example, the second buffer layer BF2 may include at least one of silicon oxide ($SiN_x$), silicon oxynitride ($SiN_xO_y$), silicon oxide ($SiO_x$), titanium oxide ($TiO_2$), and aluminum oxide ($Al_2O_3$).

The touch sensor layer TSL may be formed on the second buffer layer BF2. As shown in FIG. 4, the touch sensor layer TSL may include the driving electrodes TE, the sensing electrodes RE, the connection electrodes BE, the first driving lines TL1, the second driving lines TL2, the sensing lines RL, the guard lines GL1, GL2, GL3, GL4, and GL5, and the ground lines GRL1, GRL2, and GRL3. FIG. 6 shows only the driving electrodes TE of the touch sensor layer TSL for convenience of illustration.

The driving electrodes TE may be disposed on the second buffer layer BF2. The driving electrodes TE, the sensing electrodes RE (e.g., refer to FIG. 4), the first driving lines TL1 (e.g., refer to FIG. 4), the second driving lines TL2 (e.g., refer to FIG. 4), the sensing lines RL (e.g., refer to FIG. 4), the guard lines GL1, GL2, GL3, GL4, and GL5 (e.g., refer to FIG. 4), and the ground lines GRL1, GRL2, and GRL3 (e.g., refer to FIG. 4) may be disposed on the encapsulation layer 190. The driving electrodes TE, the sensing electrodes RE (e.g., refer to FIG. 4), the first driving lines TL1 (e.g., refer to FIG. 4), the second driving lines TL2 (e.g., refer to FIG. 4), the sensing lines RL (e.g., refer to FIG. 4), the guard lines GL1, GL2, GL3, GL4, and GL5 (e.g., refer to FIG. 4), and the ground lines GRL1, GRL2, and GRL3 (e.g., refer to FIG. 4) may be disposed on a same layer, and may be made of (or include) a same material. However, the connection electrodes BE (e.g., refer to FIG. 4) may be disposed on a different layer and made of different material from those of the driving electrodes TE. The driving electrodes TE, the sensing electrodes RE (e.g., refer to FIG. 4), the first driving lines TL1 (e.g., refer to FIG. 4), the second driving lines TL2 (e.g., refer to FIG. 4), the sensing lines RL (e.g., refer to FIG. 4), the guard lines GL1, GL2, GL3, GL4, and GL5 (e.g., refer to FIG. 4), and the ground lines GRL1, GRL2, and GRL3 (e.g., refer to FIG. 4) may be made of (or include) a stack structure (e.g., triple layers) of aluminum and titanium (Ti/Al/Ti), a stack structure (e.g., triple layers) of aluminum and ITO (ITO/Al/ITO), a single layer of an APC alloy, a stack structure (e.g., triple layers) of APC alloy and ITO (ITO/APC/ITO), or other suitable structures.

A touch insulating layer TINS may be disposed on the driving electrodes TE. The touch insulating layer TINS may include at least one of silicon oxide ($SiN_x$), silicon oxynitride ($SiN_xO_y$), silicon oxide ($SiO_x$), titanium oxide ($TiO_2$), and aluminum oxide ($Al_2O_3$). However, the disclosure is not limited thereto, and the touch insulating layer TINS may include other suitable insulating materials.

Although not shown in FIG. 6, the connection electrodes BE (e.g., refer to FIG. 4) may be disposed on the touch insulating layer TINS. Each of the connection electrodes BE (e.g., refer to FIG. 4) may be electrically connected to the driving electrodes TE through a contact hole penetrating the touch insulating layer TINS. The driving electrodes TE arranged in the second direction DR2 (e.g., refer to FIG. 5) may be electrically connected to each other by the connection electrodes BE (e.g., refer to FIG. 4). The connection electrodes BE (e.g., refer to FIG. 4) may be made up of (or include) a stack structure (e.g., triple layers) of aluminum and titanium (Ti/Al/Ti), a stack structure (e.g., triple layers) of aluminum and ITO (ITO/Al/ITO), a single layer of an APC alloy, a stack structure (e.g., triple layers) of APC alloy and ITO (ITO/APC/ITO), or other suitable structures.

The optical layer OPT may be disposed on the touch sensor layer TSL. The optical layer OPT may totally reflect the light emitted from the sub-pixels RP, GP, and BP and traveling (or guided) toward a side surface thereof in the third direction DR3. Thus, the light may travel (or be guided) in the third direction DR3. The optical layer OPT may include an organic planarization layer OPL and a high-refractive planarization layer HRF.

The organic planarization layer OPL may be disposed on the touch insulating layer TINS. The organic planarization layer OPL may overlap the pixel-defining layer 180, and may not overlap the sub-pixels RP, GP, and BP in a plan view. The organic planarization layer OPL may include an opening OPP overlapping an emission area LEP of each of the sub-pixels RP, GP, and BP in a plan view.

The organic planarization layer OPL may be formed so that side surfaces forming the inner circumferential surface of the opening OPP have a taper angle (e.g., a predetermined or selected taper angle). The taper angle of the opening OPP may be formed as a normal taper. The organic planarization layer OPL may be made of (or include) at least one of an acryl resin, an epoxy resin, a phenolic resin, a polyamide resin, and a polyimide resin. However, the disclosure is not limited thereto, and the organic planarization layer OPL may include other suitable organic materials.

The high-refractive planarization layer HRF may be disposed over the touch insulating layer TINS and the organic planarization layer OPL. The high-refractive planarization layer HRF may provide a flat surface over the opening OPP of the organic planarization layer OPL which has different heights (or step difference). Thus, a thickness of the high-refractive planarization layer HRF may be larger than a thickness of the organic planarization layer OPL.

The high-refractive planarization layer HRF may be formed as an organic layer or an organic layer containing inorganic particles. The organic layer of the high-refractive planarization layer HRF may be made of (or include) an acryl resin, an epoxy resin, a phenolic resin, a polyamide resin, and a polyimide resin. However, the disclosure is not limited thereto, and the organic layer of the high-refractive planarization layer HRF may include other suitable organic materials. The inorganic particles of the high-refractive planarization layer HRF may be made of (or include) metal particles. However, the material of the inorganic particles is not limited thereto.

A refractive index of the high-refractive planarization layer HRF may be greater than that of the organic planarization layer OPL, and the light emitted from the emission area LEP of each of the sub-pixels RP, GP, and BP may be totally reflected off the side surfaces of the organic planarization layer OPL and travel in the third direction DR3.

Light L emitted from the sub-pixels RP, GP, and BP and traveling toward the side surface of the organic planarization layer OPL may be totally reflected off the side surfaces of the organic planarization layer OPL and travel in the third direction DR3. Thus, the emission efficiency of light from the sub-pixels RP, GP, and BP may be improved, and a lifespan of the organic light-emitting diodes may be increased. Power consumption of the organic light-emitting diode display may be decreased.

A polarizing plate POL, an adhesive member OCA and a cover window CW may be disposed on the optical layer OPT.

The polarizing plate POL may be disposed on the high-refractive planarization layer HRF of the optical layer OPT. The polarizing plate POL may reduce a reflectance of external light incident from the outside, and improve display quality of the display device 10 (e.g., refer to FIG. 1).

The cover window CW may be attached on the polarizing plate POL by the adhesive member OCA. The cover window CW may prevent the underlying elements from being damaged by an external physical force. The adhesive member OCA may attach the cover window CW to the polarizing plate POL, and may be transparent.

The high-refractive planarization layer HRF of the display device 10 (e.g., refer to FIG. 1) described above may be applied on the substrate SUB via a solution process such as inkjet printing. For example, in case that a solution for the high-refractive planarization layer HRF is coated on the display panel 100 (e.g., refer to FIG. 2), the solution may spread from a center toward edges of the display panel 100 (e.g., refer to FIG. 2). Accordingly, the thickness of the solution may become thinner at the edges of the display panel 100 (e.g., refer to FIG. 2) and the non-display area NDA adjacent to the display area DA because the solution may spread unevenly. For example, since the solution spreads from the center to the edges of the display area DA, a hump, which protrudes at the edges, may be formed and the thickness of the solution may become thinner toward the non-display area NDA. In case that the light emitted from the sub-pixels passes through the hump of the high-refractive planarization layer HRF which is thicker than other portions of the high-refractive planarization layer HRF, the luminance of the emitted light may be relatively reduced at the hump. Thus, the luminance at the edges of the display panel 100 (e.g., refer to FIG. 2) may be lower than the luminance at the center thereof, and thus mura (or chrominance non-uniformity) may be noticed (or displayed).

In contrast, according to the embodiment of the disclosure, at least one valley may be formed in a first area 200 (e.g., refer to FIG. 7) which is an edge of the display area DA (e.g., refer to FIG. 7) of the display panel 100 (e.g., refer to FIG. 7), and the thickness of the high-refractive planarization layer HRF may be uniform. Accordingly, the display device 10 (e.g., refer to FIG. 1) may have uniform luminance throughout the entire display panel 100 (e.g., refer to FIG. 7).

Figure 7:
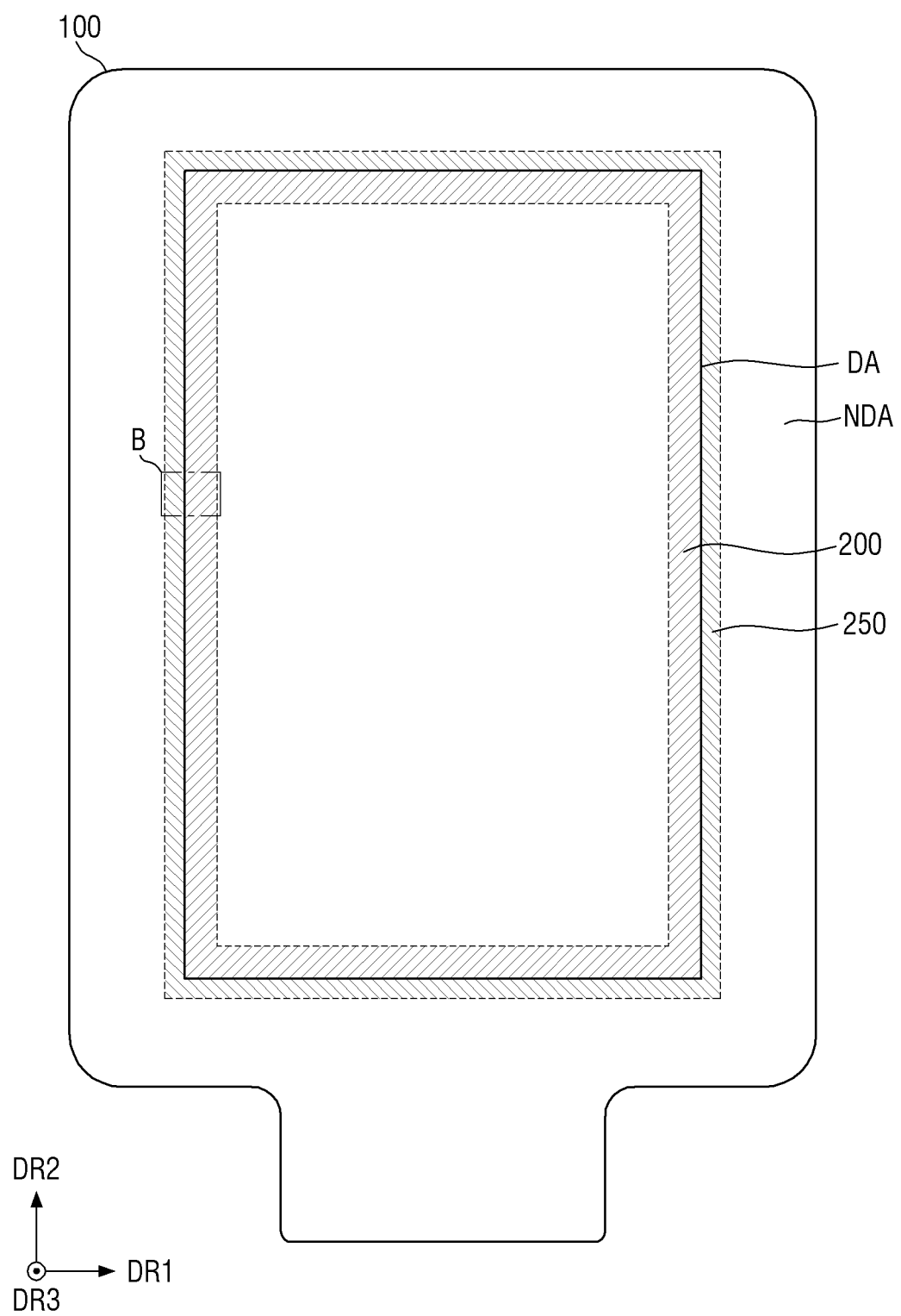
FIG. 7 is a schematic plan view showing a display panel according to an embodiment of the disclosure.
Figure 8:
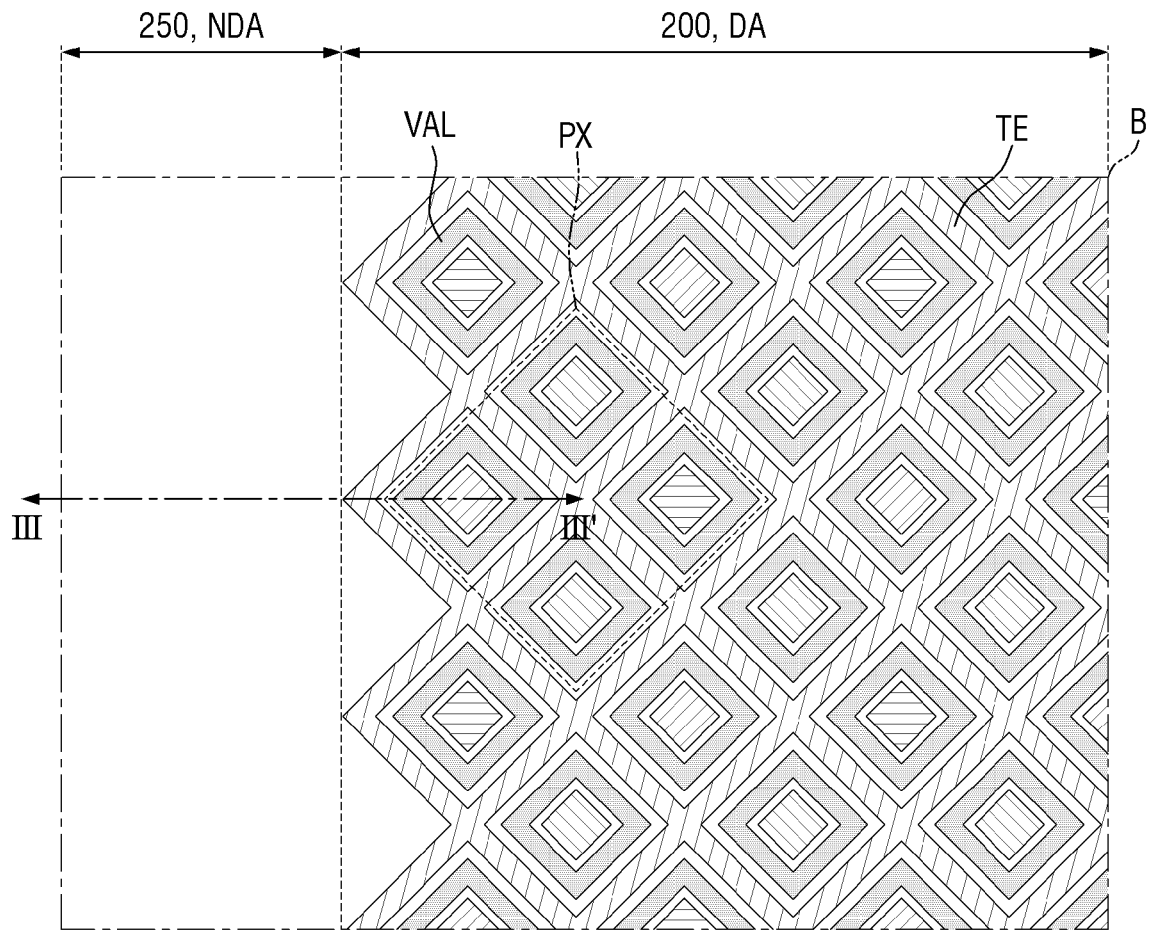
FIG. 8 is a schematic enlarged plan view of area B of FIG. 7.
Figure 9:
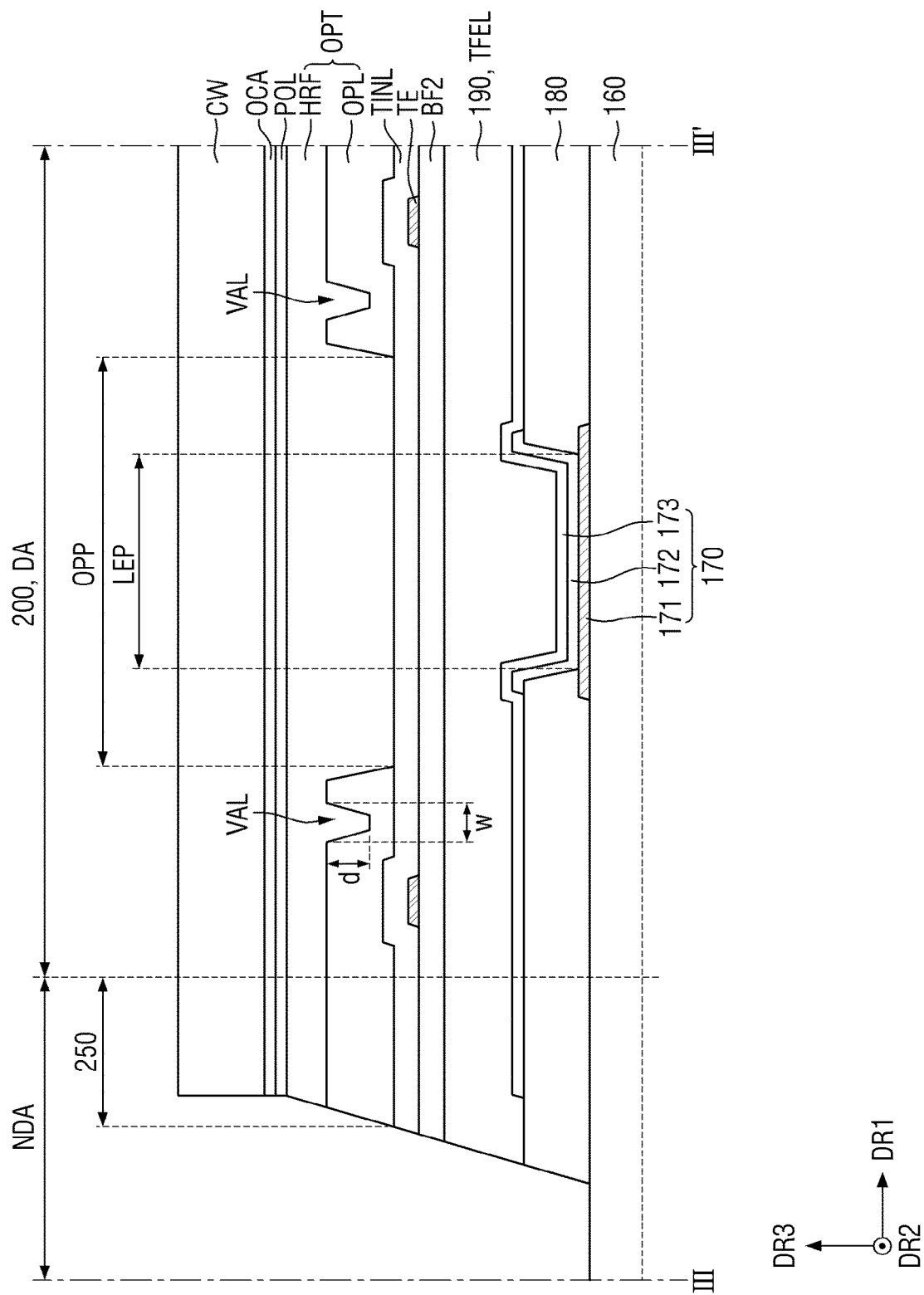
FIG. 9 is a schematic cross-sectional view taken along line III-III' of FIG. 8.
Figure 10:
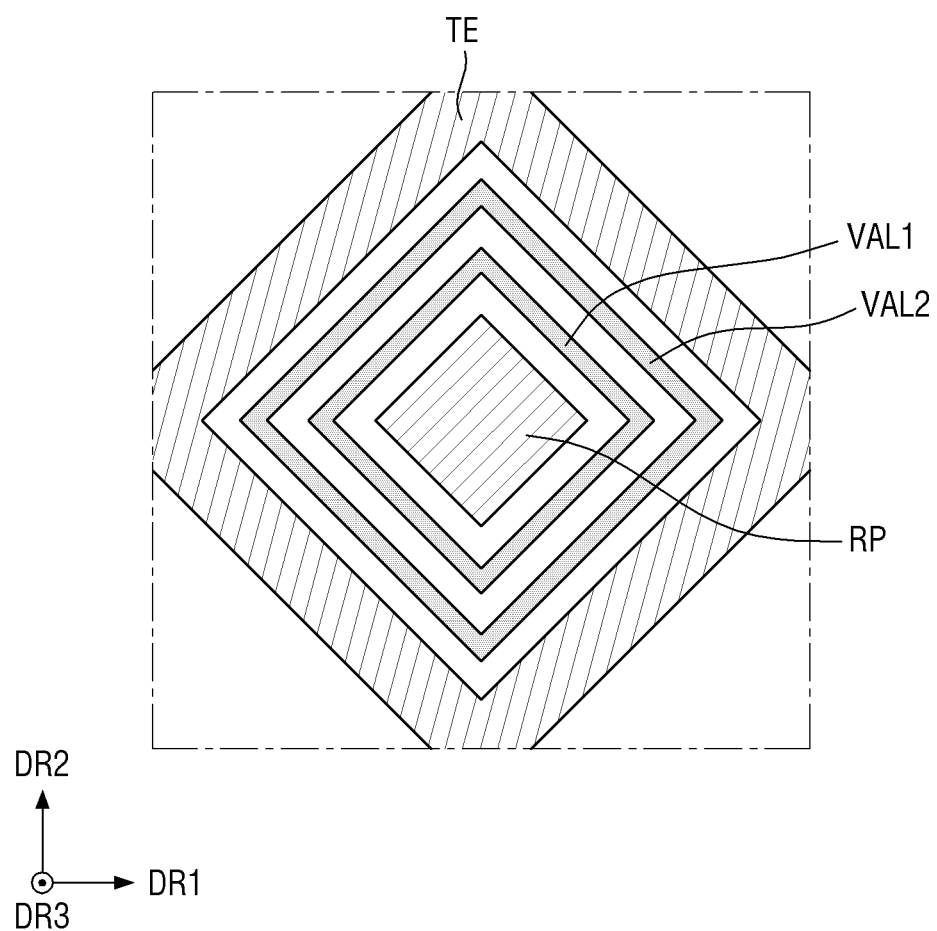
FIG. 10 is a schematic plan view showing a sub-pixel according to another embodiment of the disclosure.
Figure 11:
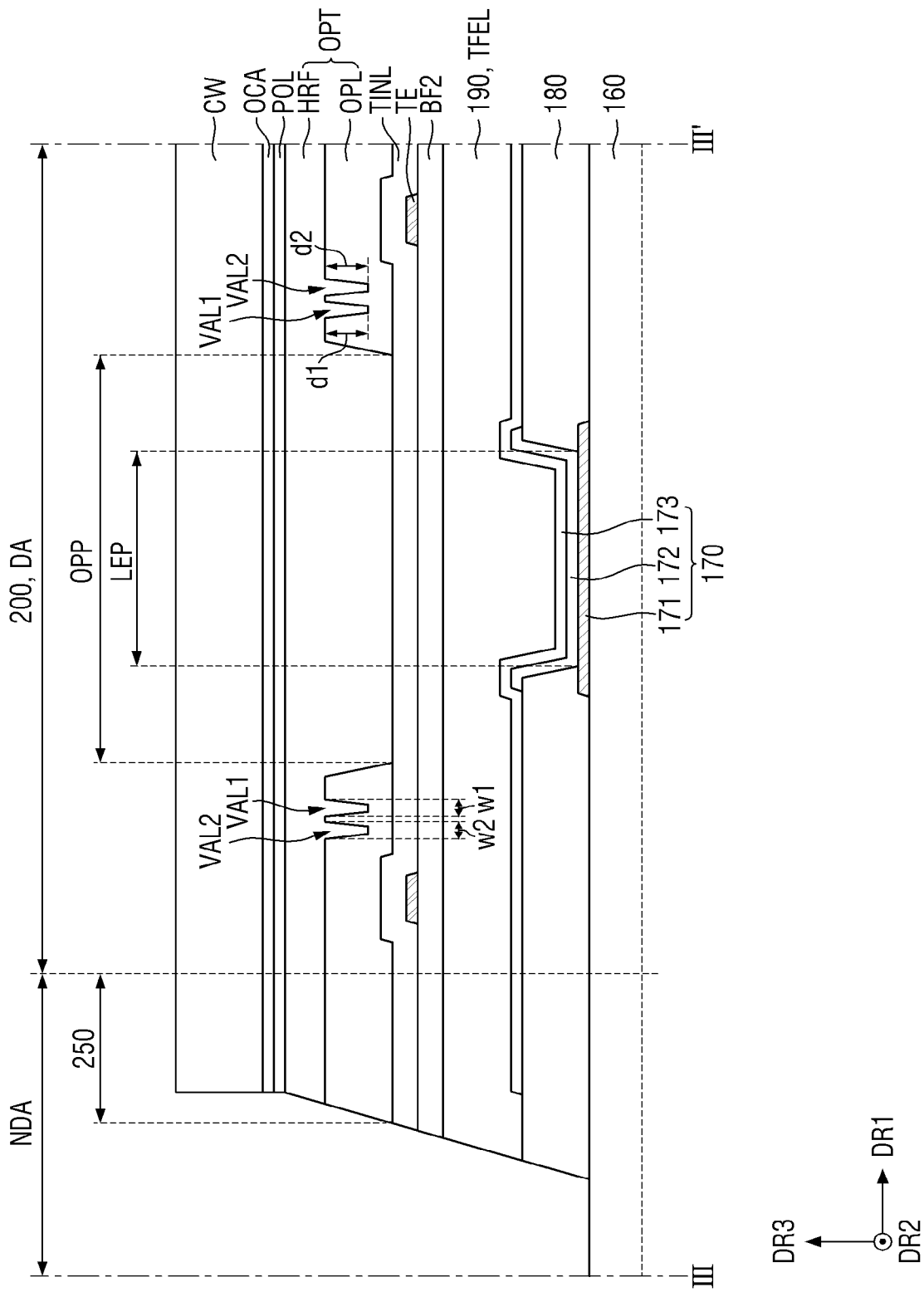
FIG. 11 is a schematic cross-sectional view showing a display panel according to another embodiment of the disclosure.
Figure 12:
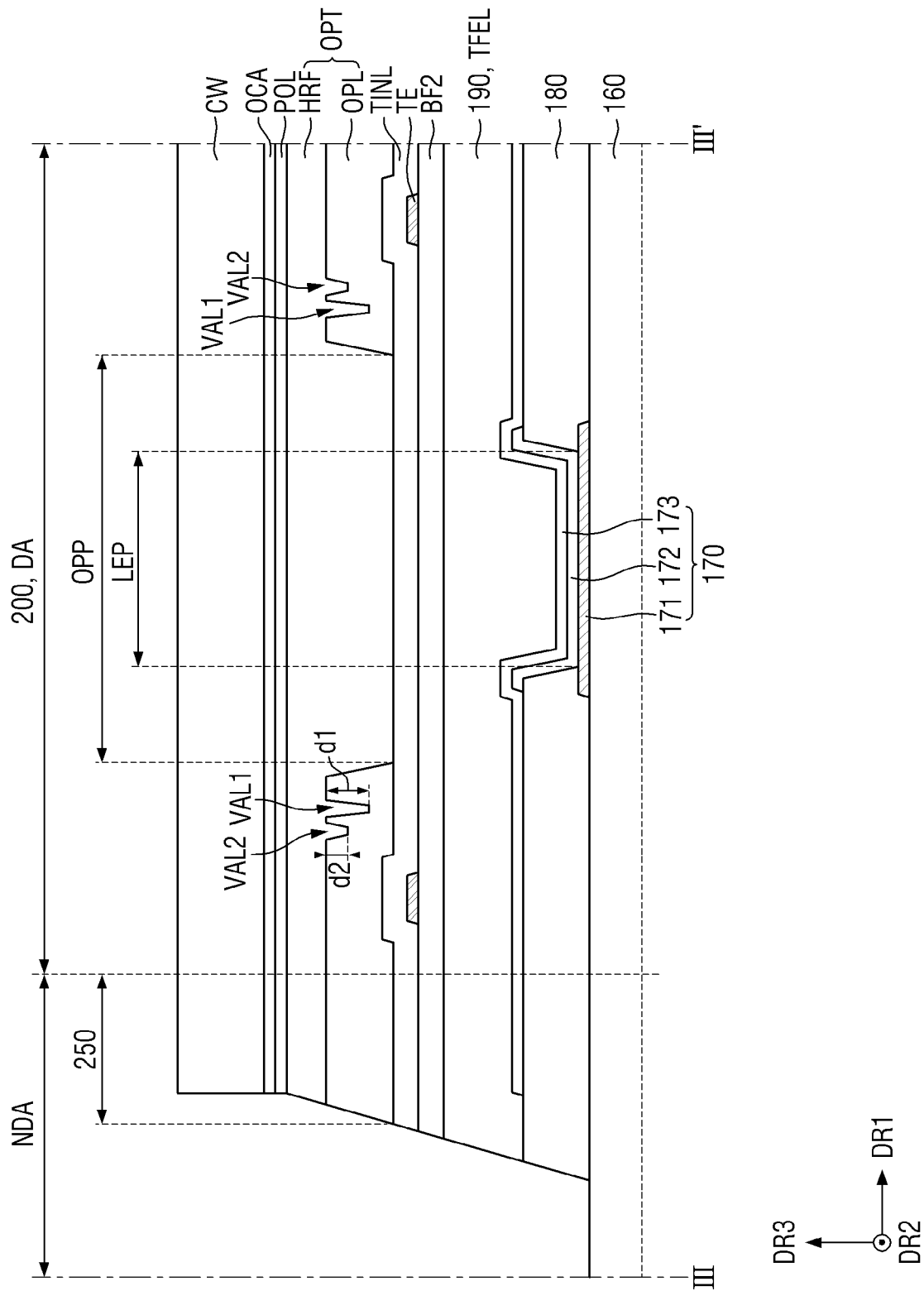
FIG. 12 is a schematic cross-sectional view showing a display panel according to another embodiment of the disclosure.

FIG. 7 is a schematic plan view showing a display panel according to an embodiment of the disclosure. FIG. 8 is a schematic enlarged plan view of area B of FIG. 7. FIG. 9 is a schematic cross-sectional view taken along line III-III' of FIG. 8. FIG. 10 is a schematic plan view showing a sub-pixel according to another embodiment of the disclosure. FIG. 11 is a schematic cross-sectional view showing a display panel according to another embodiment of the disclosure. FIG. 12 is a schematic cross-sectional view showing a display panel according to another embodiment of the disclosure.

Referring to FIGS. 7 to 9, a display device 100 may include a display area DA and a non-display area NA around the display area DA. In the display area DA, pixels PX may be arranged. Driving electrodes TE surrounding the pixels PX may be disposed in the display area DA.

The display panel 100 may include a first area 200 disposed in the display area DA and a second area 250 disposed in the non-display area NDA.

The first area 200 may correspond to an edge of the display area DA. The first area 200 may surround left, right, upper, and lower sides of the display area DA. It should be understood, however, that the disclosure is not limited thereto. The first area 200 may be at least one of the left, right, upper, and lower sides of the display area DA. The first area 200 may have a width in a range of about 1% to about 10% of a width of the display area DA measured in a first direction DR1. It should be understood, however, that the disclosure is not limited thereto. The first area 200 may have a width greater than about 10% of the width of the display area DA measured in the first direction DR1.

The second area 250 may refer to a region of the non-display area NDA which is adjacent to the display area DA and surrounds the display area DA. The second area 250 may be spaced apart from outer sides of the non-display area NDA and may be in contact with the display area DA. The second area 250 may surround the left, right, upper, and lower sides of the display area DA. It should be understood, however, that the disclosure is not limited thereto. The second area 250 may be at least one of the left, right, upper, and lower sides of the display area DA. As shown in FIG. 9, the second area 250 may be extended to the display area DA from sides of an organic planarization layer OPL overlapping the non-display area NDA in a plan view.

The organic planarization layer OPL disposed in the first area 200 of the display area DA may include valleys VAL.

Each of the valleys VAL may surround one of the first sub-pixels RP, the second sub-pixels GP, and the third sub-pixels BP in a plan view. Each of the valleys VAL may not overlap an emission area LEP of one of the first sub-pixels RP, the second sub-pixels GP, and the third sub-pixels BP in a plan view. The valleys VAL may not overlap the driving electrodes TE in a plan view.

Descriptions of the first sub-pixel RP is provided below with reference to FIG. 9. The valleys VAL may be formed in an upper surface of the organic planarization layer OPL. The valleys VAL may have a shape that is depressed from the upper surface of the organic planarization layer OPL toward an opposite side thereof in a third direction DR3. The valleys VAL may be, for example, trenches. Although the cross-sectional shape of the valleys VAL is depicted as an inverted trapezoid in the example shown in FIG. 9, the disclosure is not limited thereto. The cross-sectional shape of the valleys VAL may have a shape of a semicircle, a square, a rectangle, or the like. For example, the cross-sectional shape of the valleys VAL may have various shapes, which is depressed from the upper surface of the planarization layer OPL toward the opposite side thereof in the third direction DR3.

The valleys VAL may be disposed and surround an opening area OPP of the organic planarization layer OPL overlapping the emission area LEP in a plan view. The valleys VAL may be disposed between the driving electrodes TE surrounding the opening OPP and the opening OPP of the organic planarization layer OPL. For example, the valleys VAL may be interposed between the driving electrodes TE and the opening OPP. The valleys VAL may be spaced apart from the opening OPP and the driving electrodes TE in the first direction DR1.

The valleys VAL may have a width (e.g., a predetermined or selected width) w and a depth (e.g., a predetermined or selected depth) d. For example, the valleys VAL may have a constant width w and a constant depth d. The width w of the valleys VAL may be smaller than a distance between the opening OPP of the organic planarization layer OPL and the driving electrodes TE measured in the first direction DR1. It should be noted, however, that the disclosure is not limited thereto. The width w of the valleys VAL may be smaller than a distance between the opening OPP of the organic planarization layer OPL and driving electrodes TE of an adjacent pixel measured in the first direction DR1. The valleys VAL may overlap the driving electrodes TE in a plan view. The depth d of the valley VAL may be in a range of about 10% to about 70% of the thickness of the organic planarization layer OPL, and the hump of the high-refractive planarization layer HRF may be decreased. It should be understood, however, that the disclosure is not limited thereto. The valleys VAL may penetrate through the organic planarization layer OPL to expose an upper surface of a touch insulating layer TINL.

A shape of the valleys VAL may follow a shape of each of the sub-pixels RP, GP, and BP in a plan view. For example, in case that the shape of each of the sub-pixels RP, GP, and BP is a diamond in a plan view, the shape of the valleys VAL may also be a diamond shape surrounding the sub-pixels RP, GP, and BP. It should be understood, however, that the disclosure is not limited thereto. The shape of the valleys VAL may be formed in a circular shape, a rectangular shape, or the like in a plan view, regardless of the shape of each of the sub-pixels RP, GP, and BP. In other embodiments, the shape of the valleys VAL may be different from the shape of each of the sub-pixels RP, GP, and BP.

The shape of the valleys VAL may depend on the shape of the sub-pixels RP, GP, and BP in a plan view. For example, in case that the first sub-pixel RP, the second sub-pixel GP, and the third sub-pixel BP have the same shape in a plan view, the valleys VAL surrounding the first sub-pixel RP, the second sub-pixel GP, and the third sub-pixel BP, respectively, may have the same shape in a plan view. In other embodiments, in case that the first sub-pixel RP, the second sub-pixel GP, and the third sub-pixel BP have different shapes in a plan view, the valleys VAL surrounding the first sub-pixel RP, the second sub-pixel GP, and the third sub-pixel BP, respectively, may have different shapes in a plan view.

The above-described valleys VAL may reduce a volume of the organic planarization layer OPL. As described above, in the first area 200 corresponding to the edge of the display area DA, the hump of the high-refractive planarization layer HRF may be formed on the organic planarization layer OPL. According to the embodiment, the valleys VAL may be formed in the organic planarization layer OPL in the first area 200 to reduce the volume of the organic planarization layer OPL. Thus, the valleys VAL may be filled with a solution for the high-refractive planarization layer HRF. Therefore, a thickness of the hump of the high-refractive planarization layer HRF may be reduced. Since the thickness uniformity of the high-refractive planarization layer HRF throughout the entire display area DA is improved, the issue of mura (or chrominance non-uniformity) which may be resulted from the difference in luminance may be addressed. For example, the difference in luminance may be reduced at the edge of the display area to prevent the mura (or chrominance non-uniformity).

The valleys VAL may be disposed in every sub-pixel disposed in the first area 200 of the display panel 100.

Descriptions of a first sub-pixel RP according to an embodiment are provided below with reference to FIGS. 10 and 11. Valleys VAL may be disposed on an upper surface of an organic planarization layer OPL. The valleys VAL may include a first valley VAL1 adjacent to an opening OPP or an emission area LEP, and a second valley VAL2 adjacent to a driving electrode TE.

In a plan view, the first valley VAL1 may surround the opening OPP of the organic planarization layer OPL, and the second valley VAL2 may surround the first valley VAL2. The first valley VAL1 and the second valley VAL2 may be disposed between the driving electrode TE and the opening OPP of the organic planarization layer OPL in a plan view. The first valley VAL1 and the second valley VAL2 may be spaced apart from each other by a gap. It should be understood, however, that the disclosure is not limited thereto. The first valley VAL1 and the second valley VAL2 may be in contact with each other.

The first valley VAL1 and the second valley VAL2 may have the same width w1 and w2 and depth d1 and d2. For example, the width w1 and the depth d1 of the first valley VAL1 may be the same as the width w2 and the depth d2 of the second valley VAL2, respectively. The sum (w1+w2) of the width w1 of the first valley VAL1 and the width w2 of the second valley VAL2 may be smaller than a distance between the opening OPP of the organic planarization layer OPL and the driving electrodes TE measured in the first direction DR1. It should be understood, however, that the disclosure is not limited thereto. The sum (w1+w2) of the width w1 of the first valley VAL1 and the width w2 of the second valley VAL2 may be smaller than a distance between the opening OPP of the organic planarization layer OPL and driving electrodes TE of an adjacent pixel measured in the first direction DR1. Although the width w1 of the first valley VAL1 is equal to the width w2 of the second valley VAL2 in the drawings, the disclosure is not limited thereto. The width w1 of the first valley VAL1 may be larger or smaller than the width w2 of the second valley VAL2.

At least one of the first valley VAL1 and the second valley VAL2 may overlap the driving electrode TE in a plan view. For example, the second valley VAL2 surrounding the first valley VAL1 may overlap the driving electrode TE in a plan view. The depths d1 and d2 of the first and second valleys VAL1 and VAL2 may be in a range of about 10% to about 70% of the thickness of the organic planarization layer OPL, and a hump of the high-refractive planarization layer HRF may be decreased. However, the disclosure is not limited thereto.

Referring to FIG. 12, a depth d1 of a first valley VAL1 may be greater than a depth d2 of a second valley VAL2. The depth d1 of the first valley VAL1 adjacent to an opening OPP of an organic planarization layer OPL may be greater than the depth d2 of the second valley VAL2 disposed relatively far from the opening OPP. In case that a solution for a high-refractive planarization layer HRF is coated and spreads, the second valley VAL2, the first valley VAL1, and the opening OPP are filled with it in this order. In this instance, the solution for the high-refractive planarization layer HRF may readily spread from the second valley VAL2 having the smallest volume to the opening OPP having the largest volume.

Figure 13:
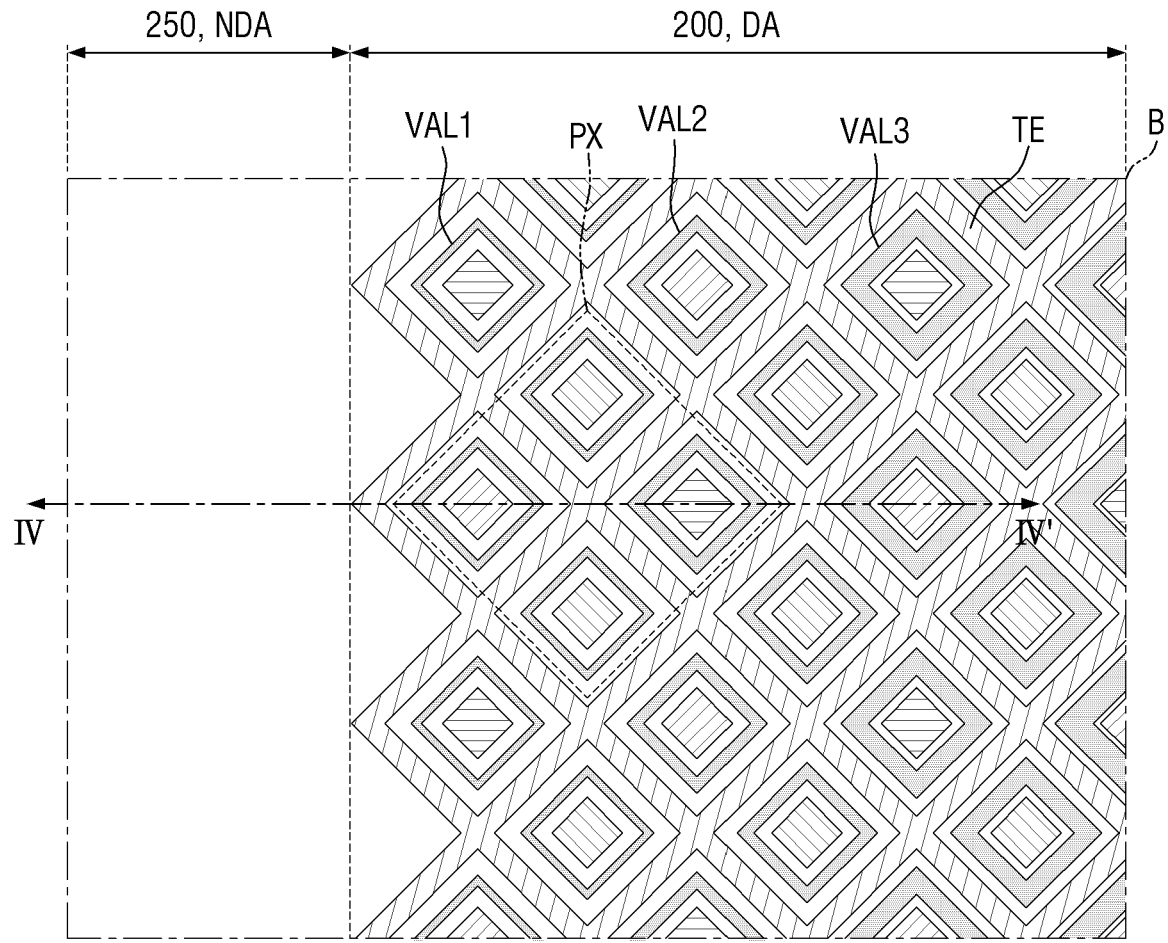
FIG. 13 is a schematic plan view showing area B of FIG. 7 according to another embodiment of the disclosure.
Figure 14:
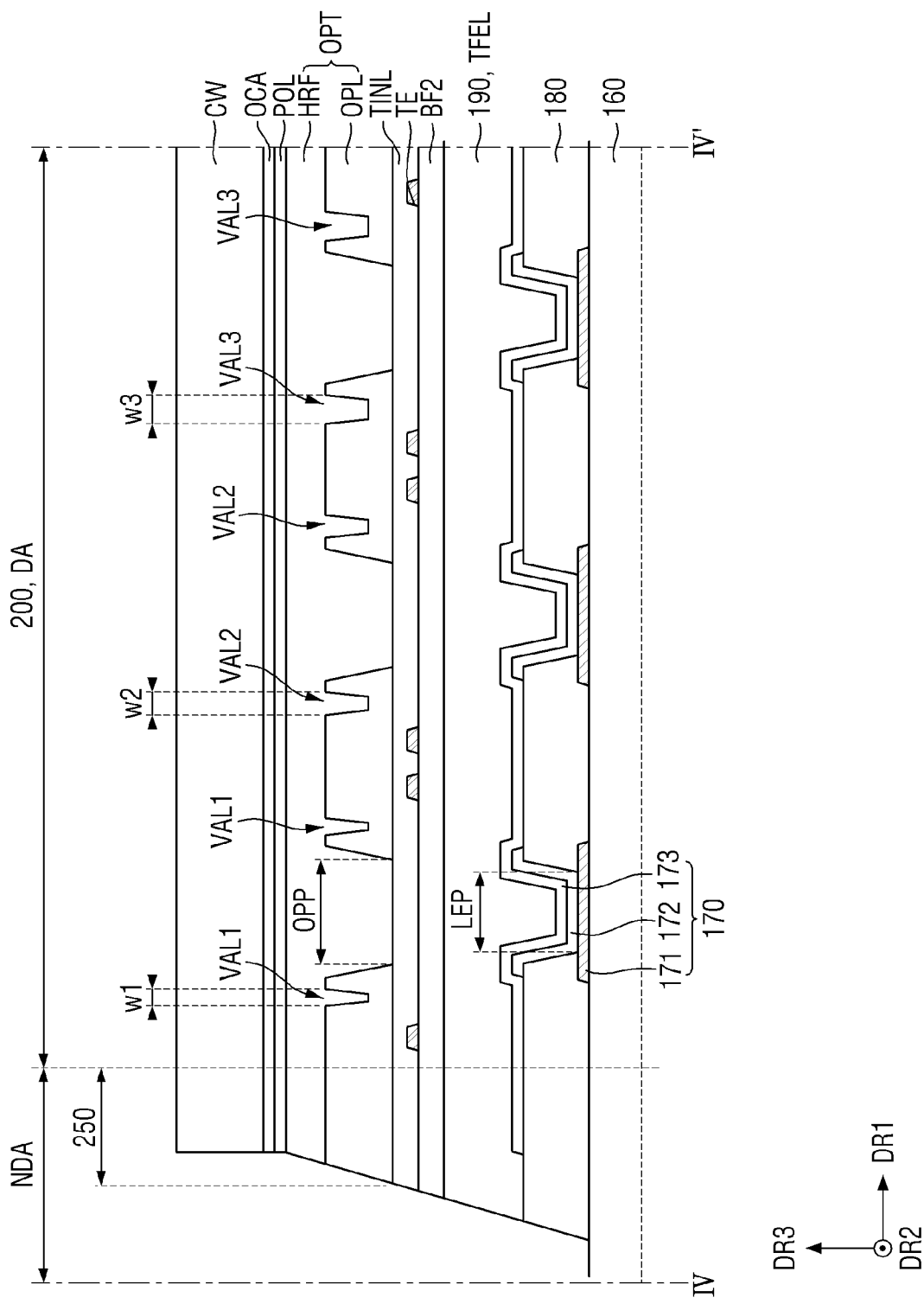
FIG. 14 is a schematic cross-sectional view taken along line IV-IV' of FIG. 13.

FIG. 13 is a schematic plan view showing area B of FIG. 7 according to another embodiment of the disclosure. FIG. 14 is a schematic cross-sectional view taken along line IV-IV' of FIG. 13.

The embodiment of FIGS. 13 and 14 is different from the embodiments of FIGS. 7 to 12 in that volumes of valleys VAL formed in sub-pixel RP, GP, and BP in a first area 200 of a display panel 100 are different from one another. In the following description, the description will focus on the difference and the redundant description will be omitted.

Valleys VAL1, VAL2, and VAL3 may be disposed in the first area 200 of the display panel 100 (e.g., refer to FIG. 7). The valleys VAL1, VAL2, and VAL3 may include a first valley VAL1, a second valley VAL2, and a third valley VAL3. The first valley VAL1 may surround a first sub-pixel RP closest to a non-display area NDA. The second valley VAL2 may surround a third sub-pixel BP disposed in a first direction DR1 from the first sub-pixel RP. The third valley VAL3 may surround a first sub-pixel RP disposed in the first direction DR1 from the third sub-pixel BP.

According to an embodiment of the disclosure, volumes of the first valley VAL1, the second valley VAL2, and the third valley VAL3 may be different from one another. In the specification, a volume of a valley refers to a volume of a space formed by an upper surface of the valley, which is coincident with an upper surface of the organic planarization layer OPL, side surfaces of the valley, and a bottom of the valley. According to the embodiment, the first valley VAL1, the second valley VAL2, and the third valley VAL3 may have different widths w1, w2, and w3, and the first valley VAL1, the second valley VAL2, and the third valley VAL3 may have different volumes. For example, the width w1 of the first valley VAL1, the width w2 of the second valley VAL2, and the width w3 of the third valley VAL3 may be different from one another. For example, the width w1 of the first valley VAL1 may be the smallest, the width w2 of the second valley VAL2 may be greater than the width w1 of the first valley VAL1, and the width w3 of the third valley VAL3 may be greater than the width w2 of the second valley VAL2. The widths w1, w2, and w3 of the valleys VAL1, VAL2, and VAL3 may gradually decrease from the display area DA toward the non-display area NDA.

Although the volumes of the valleys VAL1, VAL2, and VAL3 are controlled by adjusting the widths w1, w2, and w3 of the valleys VAL1, VAL2, and VAL3 in the example shown in the drawings, the disclosure is not limited thereto. The volumes may be controlled by adjusting depths of the valleys VAL1, VAL2, and VAL3.

As described above, a solution for a high-refractive planarization layer HRF may spread from a center of the display area DA to the non-display area NDA. In the first area 200 adjacent to the non-display area NDA, a volume of a portion where the solution for the high-refractive planarization layer HRF first arrives (i.e., the third valley VAL3 which is far from the non-display area NDA) may be the largest, and the formation of a hump may be prevented. A volume of a portion where a solution for the high-refractive planarization layer HRF last arrives (i.e., first valley VAL1 which is adjacent to non-display area NDA) may be the smallest, and the solution may spread more widely.

Figure 15:
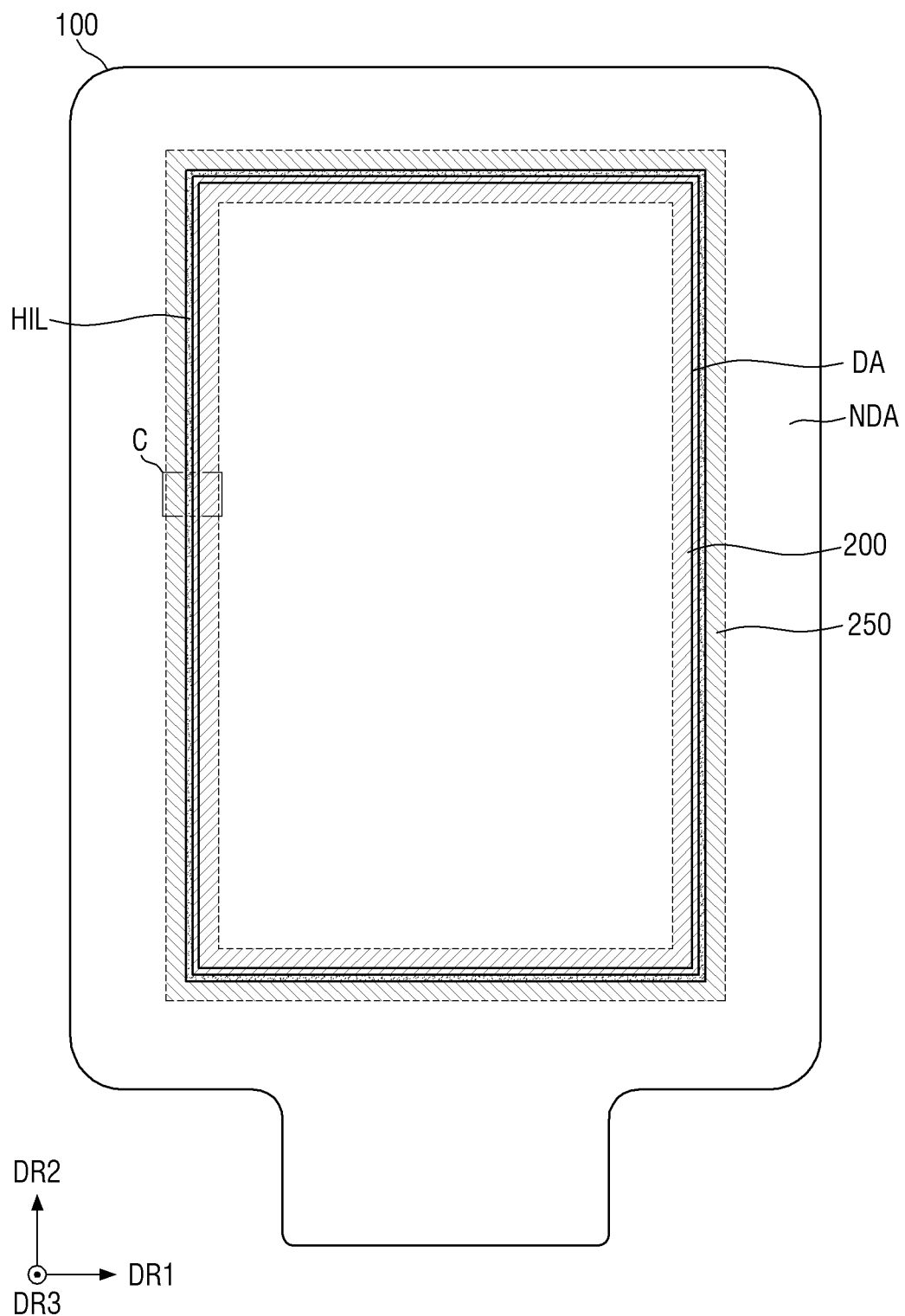
FIG. 15 is a schematic plan view showing a display panel according to another embodiment of the disclosure.
Figure 16:
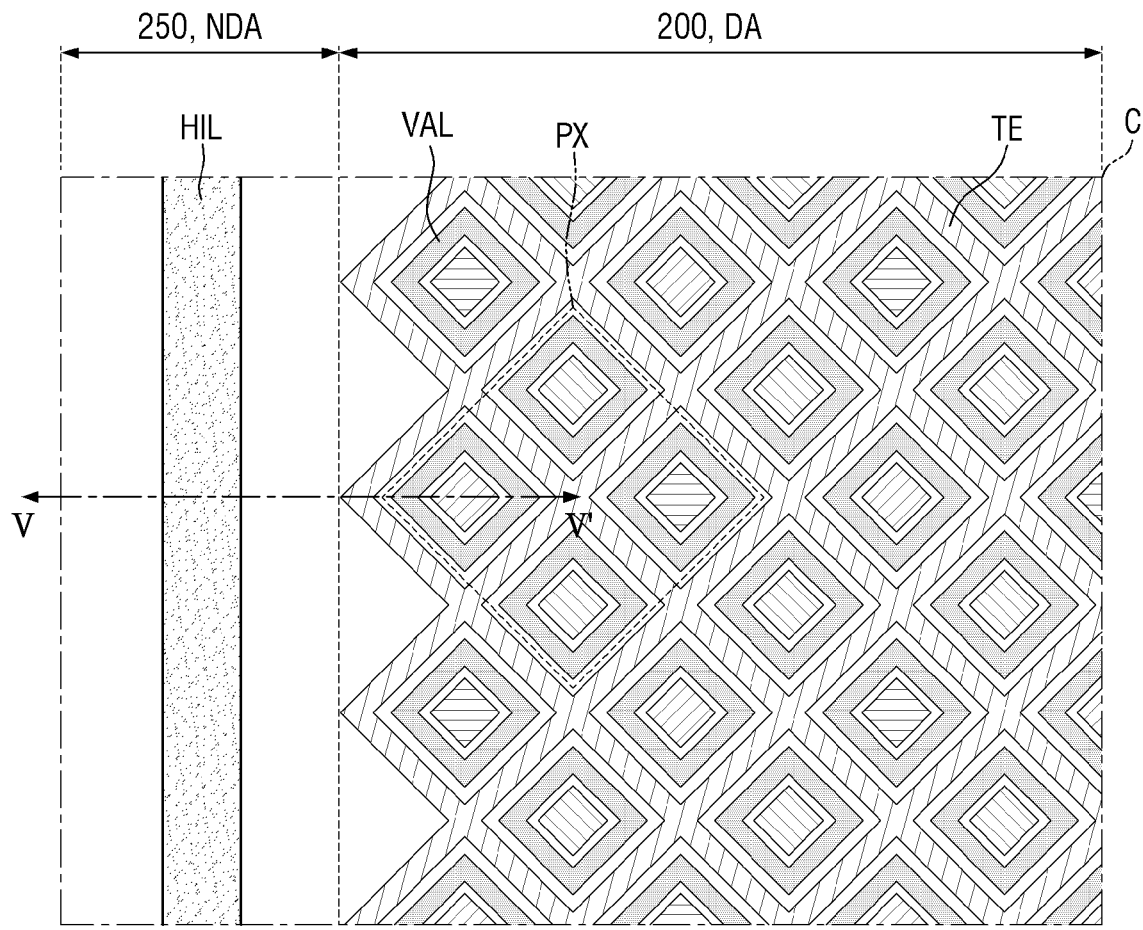
FIG. 16 is a schematic plan view showing area C of FIG. 15.
Figure 17:
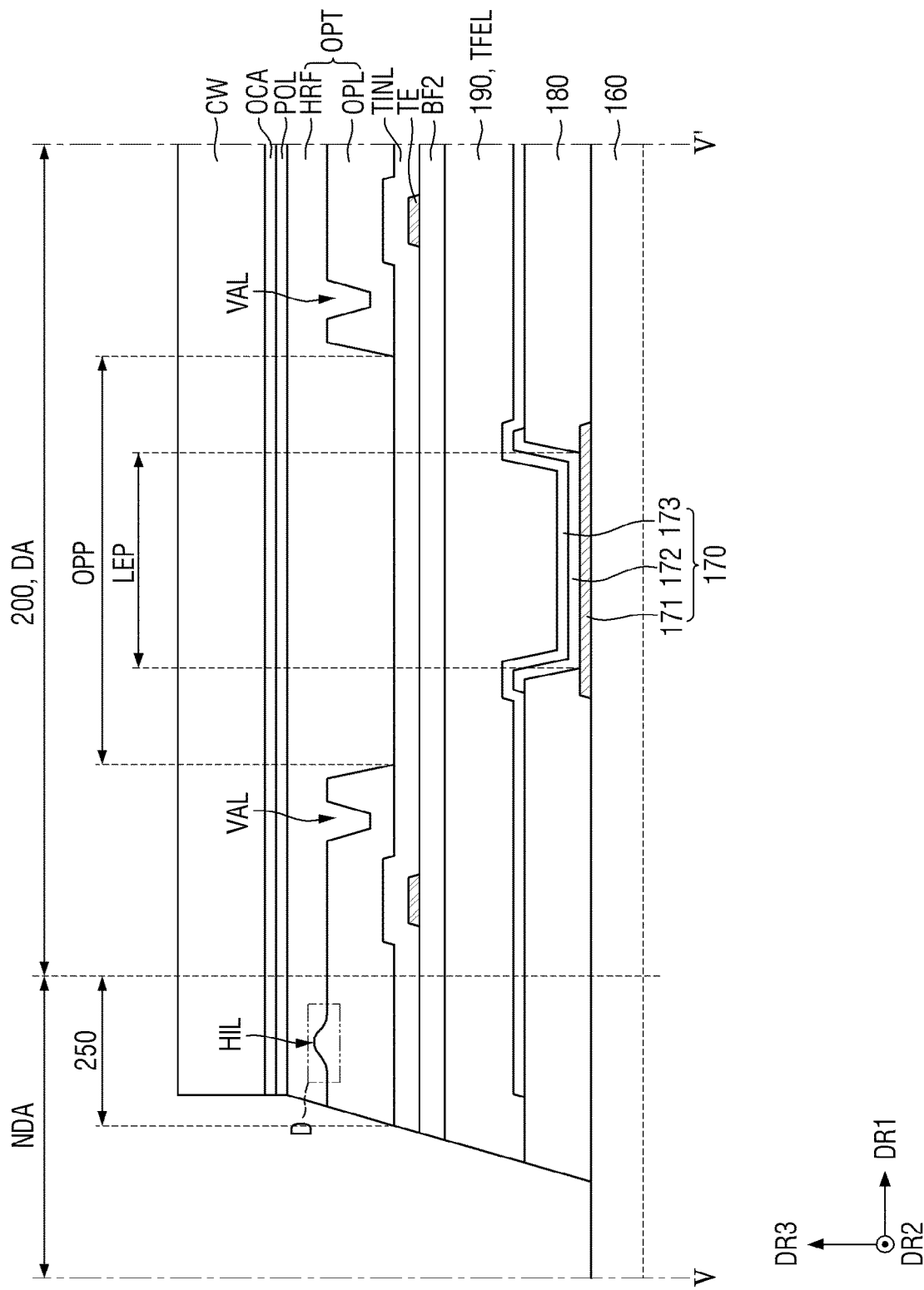
FIG. 17 is a schematic cross-sectional view taken along line V-V' of FIG. 15.
Figure 18:
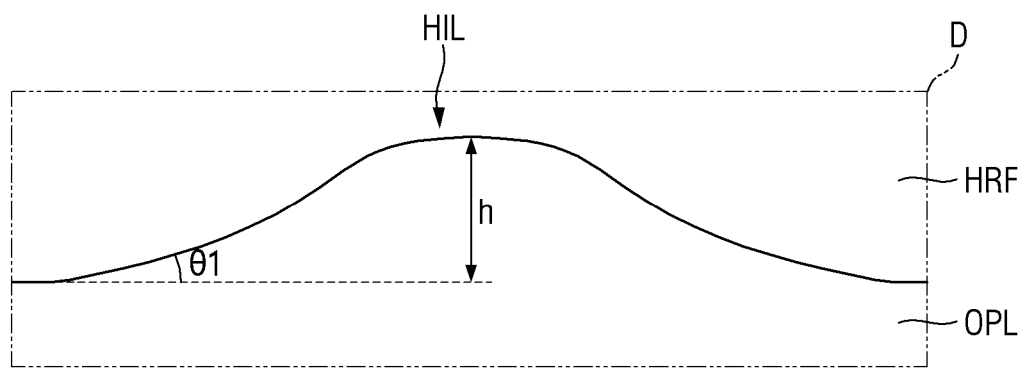
FIG. 18 is a schematic cross-sectional view showing area D of FIG. 17.
Figure 18:
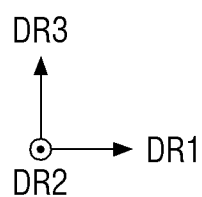

FIG. 15 is a schematic plan view showing a display panel according to another embodiment of the disclosure. FIG. 16 is a schematic plan view showing area C of FIG. 15. FIG. 17 is a schematic cross-sectional view taken along line V-V' of FIG. 15. FIG. 18 is a schematic cross-sectional view showing area D of FIG. 17.

The embodiment of FIGS. 15 to 18 is different from the embodiment of FIGS. 7 to 14 in that at least one protrusion HIL is further disposed in the second area 250 of the display panel 100. In the following description, the description will focus on the difference and the redundant description will be omitted.

The display panel 100 may include a first area 200 disposed in a display area DA and a second area 250 disposed in a non-display area NDA. An organic planarization layer OPL disposed in the first area 200 of the display area DA may include valleys VAL.

According to the embodiment, the organic planarization layer OPL disposed in the second area 250 of the non-display area NDA may include at least one protrusion HIL. The protrusion HIL may surround the display area DA in a plan view. The protrusion HIL may be spaced apart from the display area DA and disposed adjacent to the display area DA. The protrusion HIL may have a closed-loop shape surrounding the display area DA in a plan view.

Referring to FIGS. 17 and 18, the second area 250 and a first sub-pixel RP disposed in the first area 200 of the display area DA are illustrated. The protrusion HIL may be disposed on an upper surface of the organic planarization layer OPL. The protrusion HIL may have a shape protruding from the upper surface of the organic planarization layer OPL in a third direction DR3.

The protrusion HIL may have a taper angle $\theta 1$ and a height h. The protrusion HIL may have the height h in a range of about 1% to about 10% relative to a thickness of the organic planarization layer OPL, and a volume of a space under the high-refractive planarization layer HRF may be reduced. The height h of the protrusion HIL may be smaller than a thickness of the high-refractive planarization layer HRF overlapping the upper surface of the organic planarization layer OPL in a plan view except for the protrusion HIL in the second area 250. For example, the height h of the protrusion HIL may be smaller than a distance between a lower surface of a polarizing plate POL and the upper surface of the organic planarization layer OPL in a plan view except for the protrusion HIL in the second area 250. Thus, an adhesion of the polarizing plate POL disposed on the high-refractive planarization layer HRF may not be weakened.

The protrusion HIL may have a taper angle $\theta 1$ in a range of about 10 degrees to about 30 degrees. In case that the taper angle $\theta 1$ of the protrusion HIL is equal to or greater than 10 degrees, the thickness of the high-refractive planarization layer HRF applied on the protrusion HIL may not be too thin (e.g., may have enough thickness). In case that the taper angle $\theta 1$ of the protrusion HIL is equal to or less than 30 degrees, a solution for the high-refractive planarization layer HRF may spread evenly.

The protrusion HIL may reduce a volume of a space under the high-refractive planarization layer HRF. For example, the protrusion HIL may reduce the volume of the high-refractive planarization layer HRF, which is disposed on the organic planarization layer OPL.

As described above, the valleys VAL may be formed in the first area 200 corresponding to the edge of the display area DA to reduce a volume of an organic planarization layer OPL. Thus, the valleys VAL may be filled with a solution for the high-refractive planarization layer HRF. Thus, a thickness of the hump of the high-refractive planarization layer HRF may be reduced. The high-refractive planarization layer HRF may become thinner from the first area 200 to the second area 250. For example, the thickness of the high-refractive planarization layer HRF may be decreased as a distance from the second area 250 is decreased. According to the embodiment, the protrusion HIL may be formed in the second area 250, and the thickness of the high-refractive planarization layer HRF may be increased due to the protrusion HIL. Thus, the thickness uniformity between the second area 250 and the first area 200 may be improved.

The valleys VAL may be formed in the first area 200 and the protrusion HIL may be disposed in the second area 250. Thus, the thickness uniformity of the high-refractive planarization layer HRF may be improved throughout the entire display area DA. Thus, issue of mura (or chrominance non-uniformity) due to differences in luminance may be addressed. For example, the difference in luminance may be reduced at the edge of the display area DA to prevent the mura (or chrominance non-uniformity).

It should be noted that protrusions HIL may be disposed in second area 250 of the display panel 100.

Figure 19:
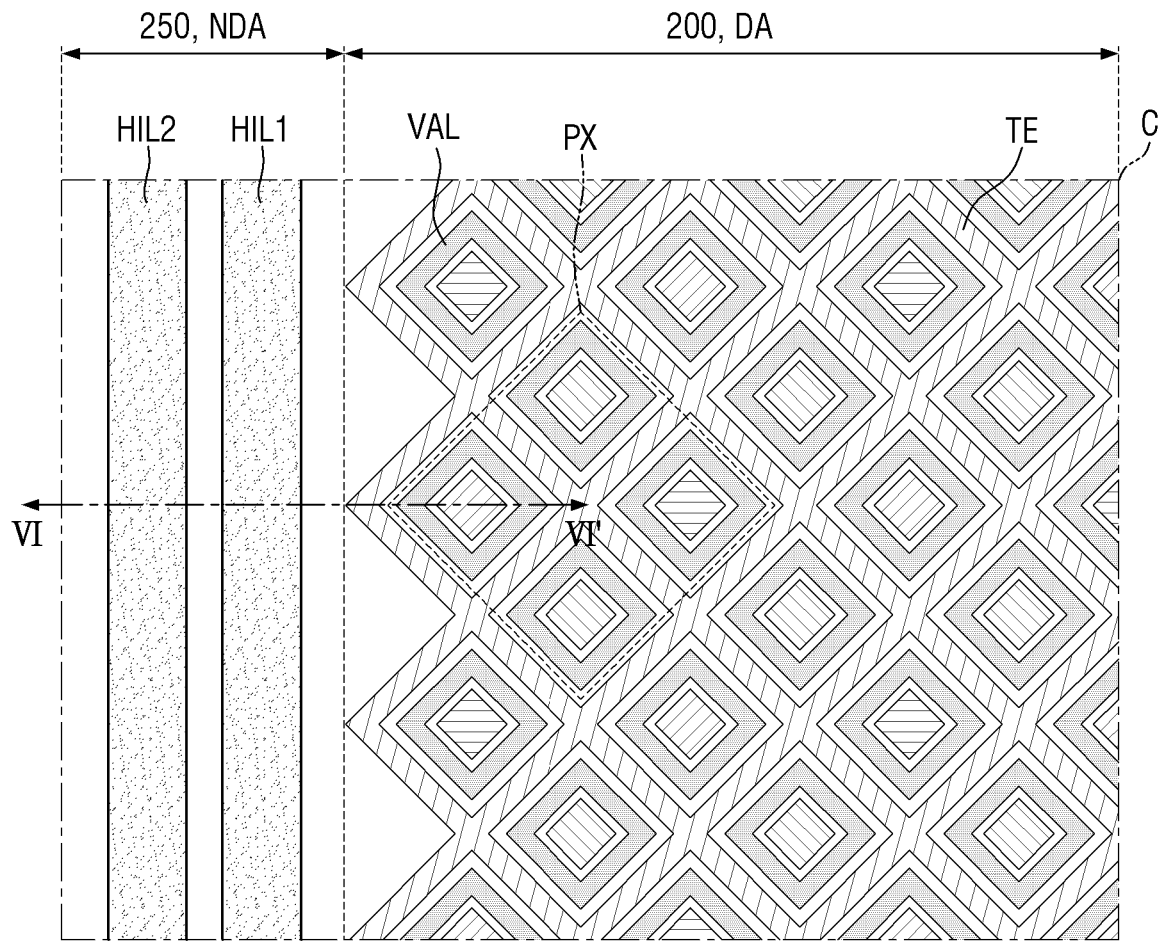
FIG. 19 is a schematic plan view showing area C of FIG. 15 according to another embodiment of the disclosure.
Figure 20:
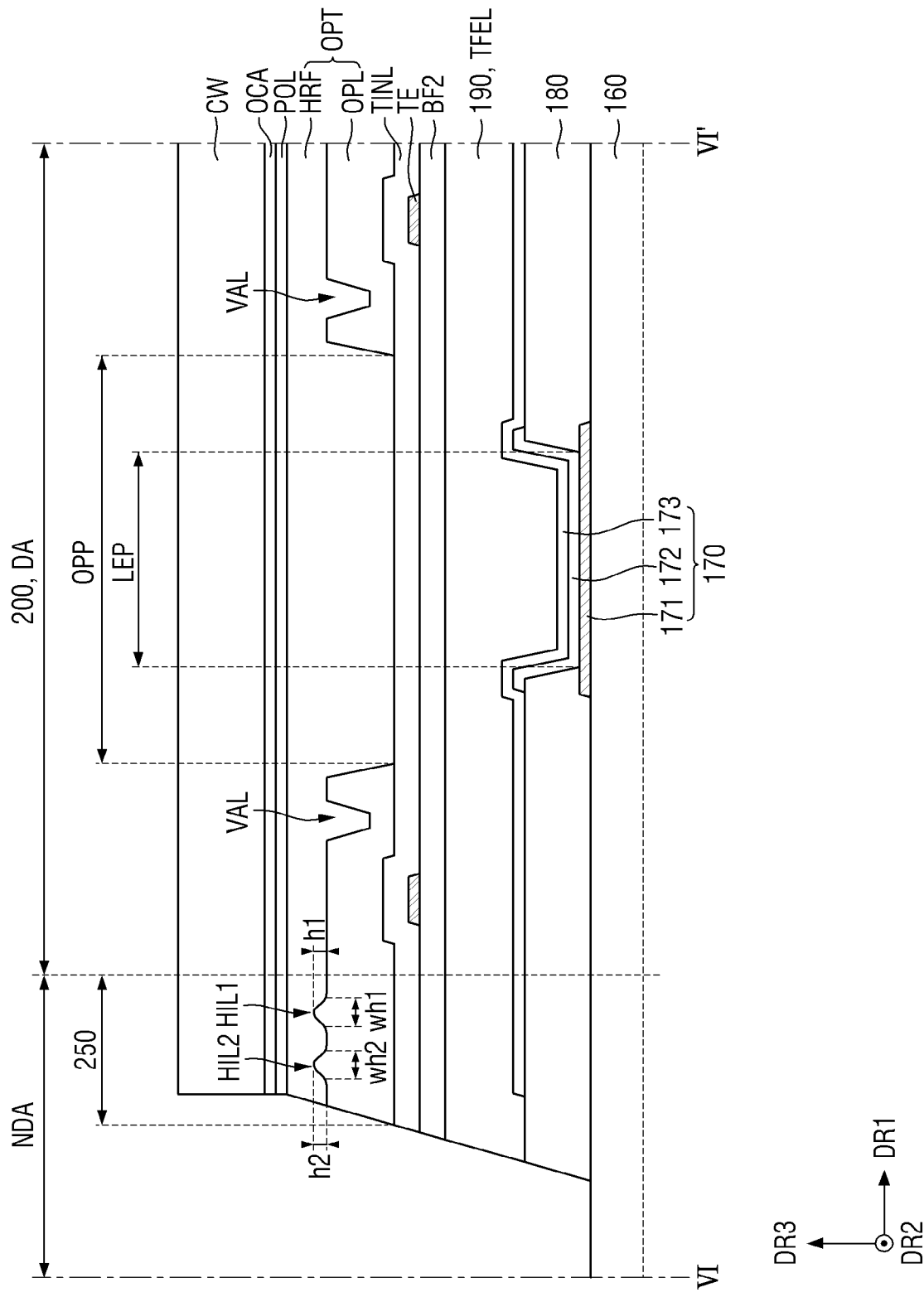
FIG. 20 is a schematic cross-sectional view taken along line VI-VI' of FIG. 19.
Figure 21:
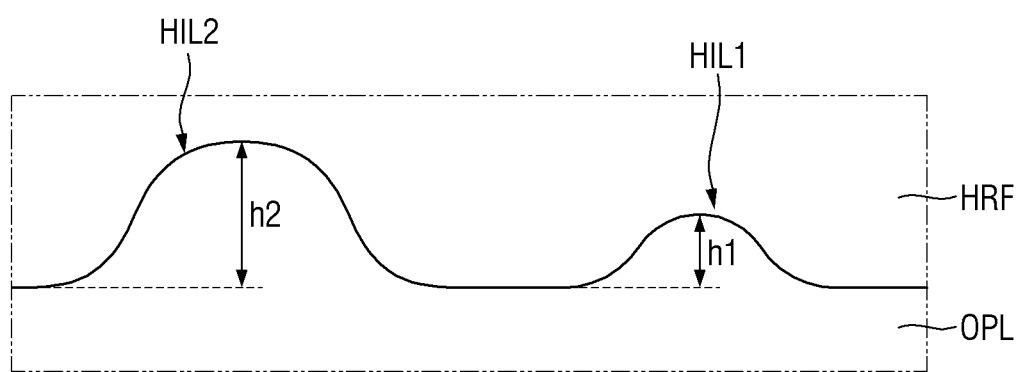
FIG. 21 is a schematic cross-sectional view showing protrusions according to another embodiment of the disclosure.
Figure 21:
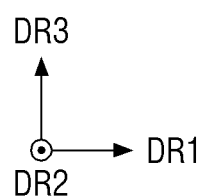
Figure 22:
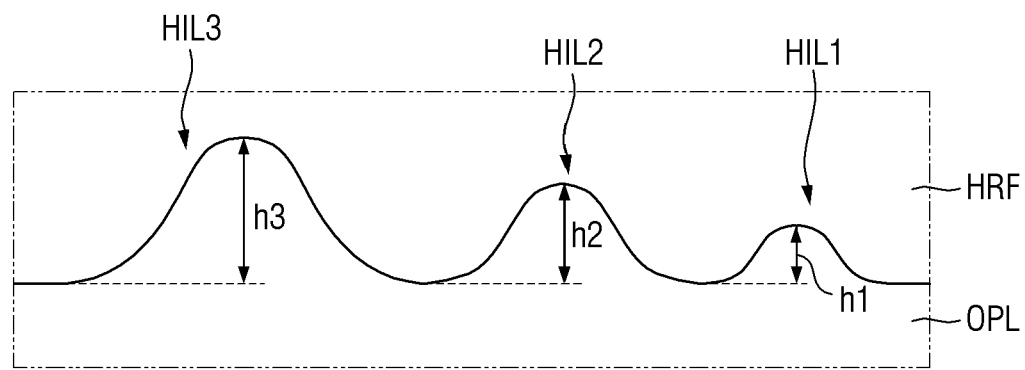
FIG. 22 is a schematic cross-sectional view showing protrusions according to another embodiment of the disclosure.
Figure 22:
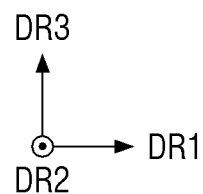
Figure 23:
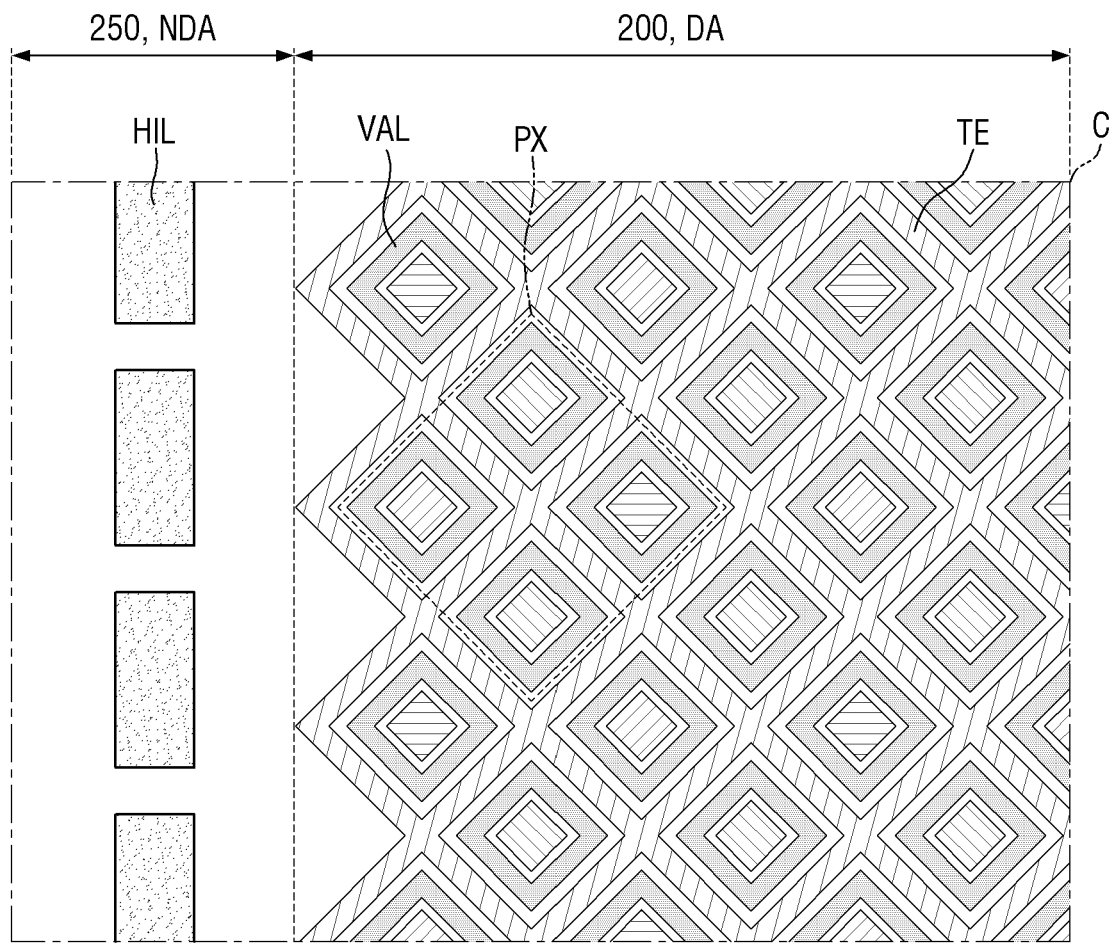
FIG. 23 is a schematic plan view showing area C of FIG. 15 according to another embodiment of the disclosure.

FIG. 19 is a schematic plan view showing area C of FIG. 15 according to another embodiment of the disclosure. FIG. 20 is a schematic cross-sectional view taken along line VI-VI' of FIG. 19. FIG. 21 is a schematic cross-sectional view showing protrusions according to another embodiment of the disclosure. FIG. 22 is a schematic cross-sectional view showing protrusions according to another embodiment of the disclosure. FIG. 23 is a schematic plan view showing area C of FIG. 15 according to another embodiment of the disclosure.

Referring to FIGS. 19 and 20, protrusions HIL may be disposed on an upper surface of an organic planarization layer OPL in a second area 250. The protrusions HIL may include a first protrusion HIL1 and a second protrusion HIL2. The first protrusion HIL1 may be disposed adjacent to a display area DA and a first area 200. The second protrusion HIL2 may be spaced apart from the first protrusion HIL1 in an opposite direction to a first direction DR1.

In a plan view, the first protrusion HIL1 may surround the display area DA, and the second protrusion HIL2 may surround the first protrusion HIL1. The first protrusion HIL1 and the second protrusion HIL2 may be disposed between an outer side of a non-display area NDA and the display area DA in a plan view. The first protrusion HIL1 and the second protrusion HIL2 may be spaced apart from each other by a gap. It should be understood, however, that the disclosure is not limited thereto. The first protrusion HIL1 and the second protrusion HIL2 may be in contact with each other.

The first protrusion HIL1 and the second protrusion HIL2 may have the same width wh1 and wh2 and height h1 and h2. For example, the width wh1 and the height h1 of the first protrusion HIL1 may be the same as the width wh2 and the height h2 of the second protrusion HIL2, respectively. The sum (wh1+wh2) of the width wh1 of the first protrusion HIL1 and the width wh2 of the second protrusion HIL2 may be equal to or smaller than a width of the organic planarization layer OPL measured in the first direction DR1 in the second area 250. Although the width wh1 of the first protrusion HIL1 is equal to the width wh2 of the second protrusion HIL2 in the drawings, the disclosure is not limited thereto. The width wh1 of the first protrusion HIL1 may be larger or smaller than the width wh2 of the second protrusion HIL2.

Each of the heights h1 and h2 of the first protrusion HIL1 and the second protrusion HIL2 may be smaller than a thickness of the high-refractive planarization layer HRF overlapping the upper surface of the organic planarization layer OPL in a plan view except for the protrusions HIL1 and HIL2 in the second area 250. Thus, an adhesion of a polarizing plate POL disposed on the high-refractive planarization layer HRF may not be weakened.

Referring to FIG. 21, according to another embodiment, a height h1 of a first protrusion HIL1 may be smaller than a height h2 of a second protrusion HIL2. The height h1 of the first protrusion HIL1 adjacent to a display area DA may be smaller than the height h2 of the second protrusion HIL2 relatively far from the display area DA. In case that a solution for a high-refractive planarization layer HRF is coated and spreads, the solution may arrive at the first protrusion HIL1 and the second protrusion HIL2. The protrusions HIL1 and HIL2 may be arranged such that their heights h1 and h2 increase. For example, the protrusions HIL1 and HIL2 may be sequentially arranged in the heights h1 and h2 thereof. Thus, the solution for the high-refractive planarization layer HRF may have a uniform thickness in the display area DA and may readily spread in the non-display area NDA.

Referring to FIGS. 19, 20, and 22, in another embodiment, three or more protrusions HIL1, HIL2, and HIL3 may be disposed on an upper surface of an organic planarization layer OPL in a second area 250. The protrusions HIL1, HIL2, and HIL3 may include a first protrusion HIL1, a second protrusion HIL2, and a third protrusion HIL3. The first protrusion HIL1 may be disposed adjacent to a display area DA and a first area 200. The second protrusion HIL2 may be spaced apart from the first protrusion HIL1 in an opposite direction to a first direction DR1. The third protrusion HIL3 may be spaced apart from the second protrusion HIL2 in the opposite direction to the first direction DR1.

In a plan view, the first protrusion HIL1 may surround the display area DA. The second protrusion HIL2 may surround the first protrusion HIL1. The third protrusion HIL3 may surround the second protrusion HIL2. The first protrusion HIL1, the second protrusion HIL2, and the third protrusion HIL3 may be spaced apart from one another by a distance. It should be understood, however, that the disclosure is not limited thereto. The first protrusion HIL1, the second protrusion HIL2, and the third protrude HIL3 may be in contact with one another.

The first protrusion HIL1, the second protrusion HIL2, and the third protrusion HIL3 may have different heights h1, h2 and h3 from one another. For example, the heights h1, h2 and h3 of the first protrusion HIL1, the second protrusion HIL2, and the third protrusion HIL3, respectively, may decrease toward the display area DA.

For example, the height h1 of the first protrusion HIL1 may be smaller than the height h2 of the second protrusion HIL2, and the height h2 of the second protrusion HIL2 may be smaller than the height h3 of the third protrusion HIL3. The height h1 of the first protrusion HIL1, which is disposed adjacent to the display area DA, may be smaller than the height h3 of the third protrusion HIL3, which is disposed relatively far from the display area DA. In case that a solution for a high-refractive planarization layer HRF is coated and spreads, the solution may arrive at the first protrusion HIL1, the second protrusion HIL2, and the third protrusion HIL3. The protrusions HIL1, HIL2, and HIL3 may be arranged such that their heights h1, h2, and h3 increase. For example, the protrusions HIL1, HIL2, and HIL3 may be sequentially arranged in the heights h1, h2, and h3 thereof. Thus, the solution for the high-refractive planarization layer HRF may have a uniform thickness in the display area DA and may readily spread in the non-display area NDA.

Referring to FIG. 23, a protrusion HIL according to an embodiment may have island patterns in a second area 250. In the above-described embodiments, the protrusions HIL (e.g., refer to FIGS. 15 to 22) may have closed-loop shapes. In the embodiment of FIG. 23, the protrusion HIL may have a shape of the island patterns.

A solution for a high-refractive planarization layer HRF may spread more readily through a space between the island patterns of the protrusions HIL from a display area DA to a non-display area NDA. Thus, the high-refractive planarization layer HRF may be coated more widely, and the thickness uniformity thereof may be improved.

Hereinafter, detailed description of the embodiments is provided with reference to Simulation and Experimental Examples.

Simulation: Measurement of Mura (or Chrominance Non-Uniformity) on Display Panel Depending on Hump Height of Organic Planarization Layer Simulation was conducted on the display panel having the structure as shown in FIG. 6. Mura level on the display panel versus the height of the hump on the organic planarization layer formed at the edge of the display area, and the width of a shade on the display panel versus the mura level were measured. Results are shown in FIGS. 24 and 25.

Figure 24:
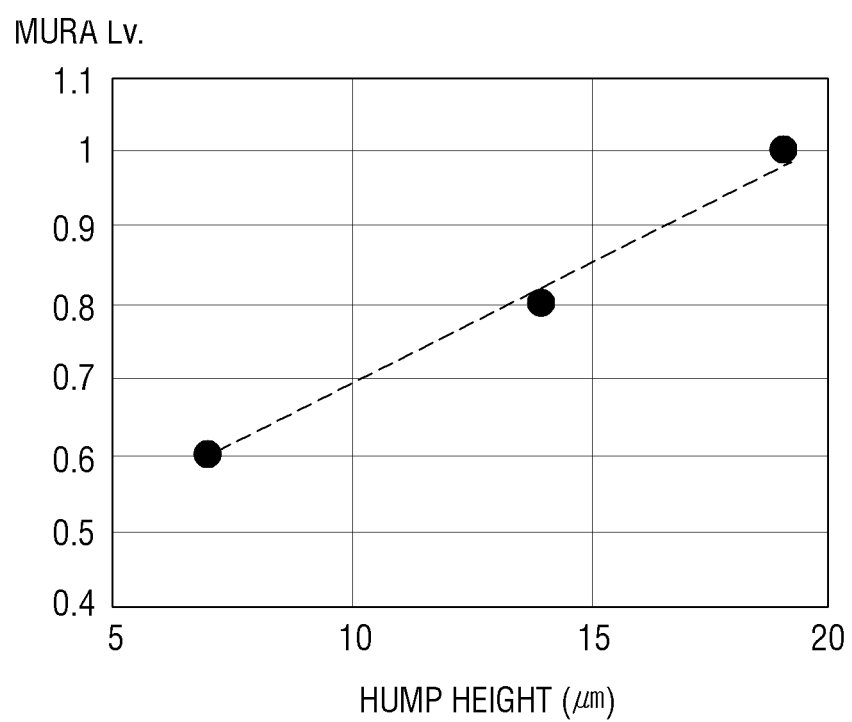
FIG. 24 is a graph showing mura level of a display panel versus a hump height of an organic planarization layer.

FIG. 24 is a graph showing mura level of a display panel versus a hump height of an organic planarization layer. FIG. 25 is a graph showing a shade width versus mura level of the display panel.

Referring to FIG. 24, as the height of the hump of the organic planarization layer increases, the level (e.g., degree) of mura (or chrominance non-uniformity) appearing on the display panel increases proportionally. In the specification, mura (or chrominance non-uniformity) refers to a phenomenon that a luminance at the edge of the display area of the display panel is lower than the luminance at the center thereof, and thus the difference in luminance is noticeable (e.g., visible to user).

Figure 25:
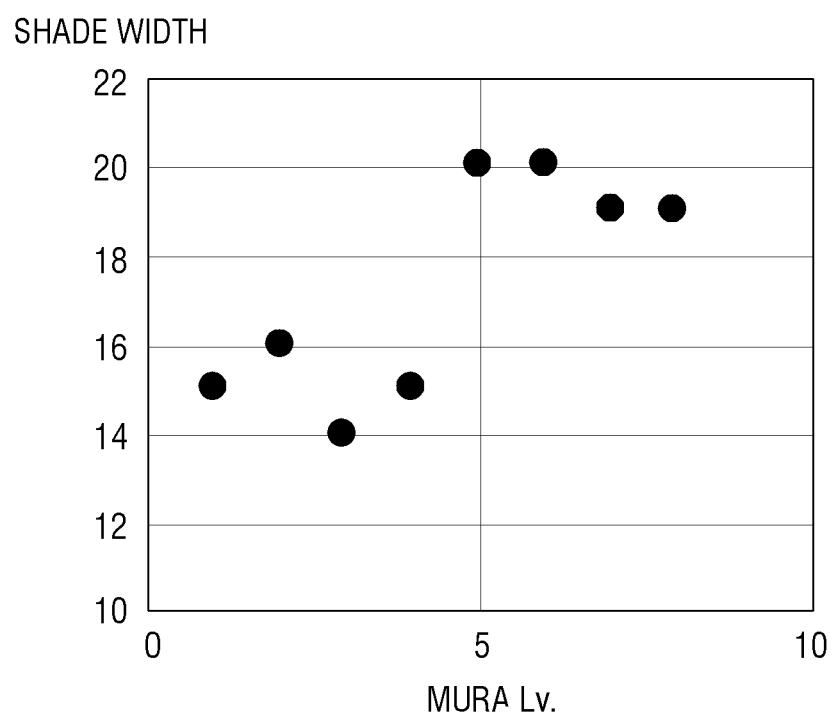
FIG. 25 is a graph showing a shade width versus mura level of the display panel.

FIG. 25 shows that the width of the shade (e.g., region that looks dark due to low luminance) was in a range of 14 to 22 in case that mura level is in a range of 1, 2, 3 and 4. However, the width of the shade was in a range of 19 and 20 in case that mura level is in a range of 5, 6, 7 and 8.

It can be seen from the results of the simulation that the width of the shade can be reduced by reducing the mura level by lowering the height of the hump of the organic planarization layer. For example, the height of the hump of the organic planarization layer was decreased, and the mura level was reduced. Thus, the width of the shade was reduced in the display panel.

Experimental Example

As shown in FIG. 8, the valleys was formed in the organic planarization layer, and the high-refractive planarization layer was coated thereon. Subsequently, the thickness of the organic planarization layer was measured at the boundary between the display area and the non-display area. Comparative Example was different from Example (e.g., refer to FIG. 8) in that the valleys was not formed.

Figure 26:
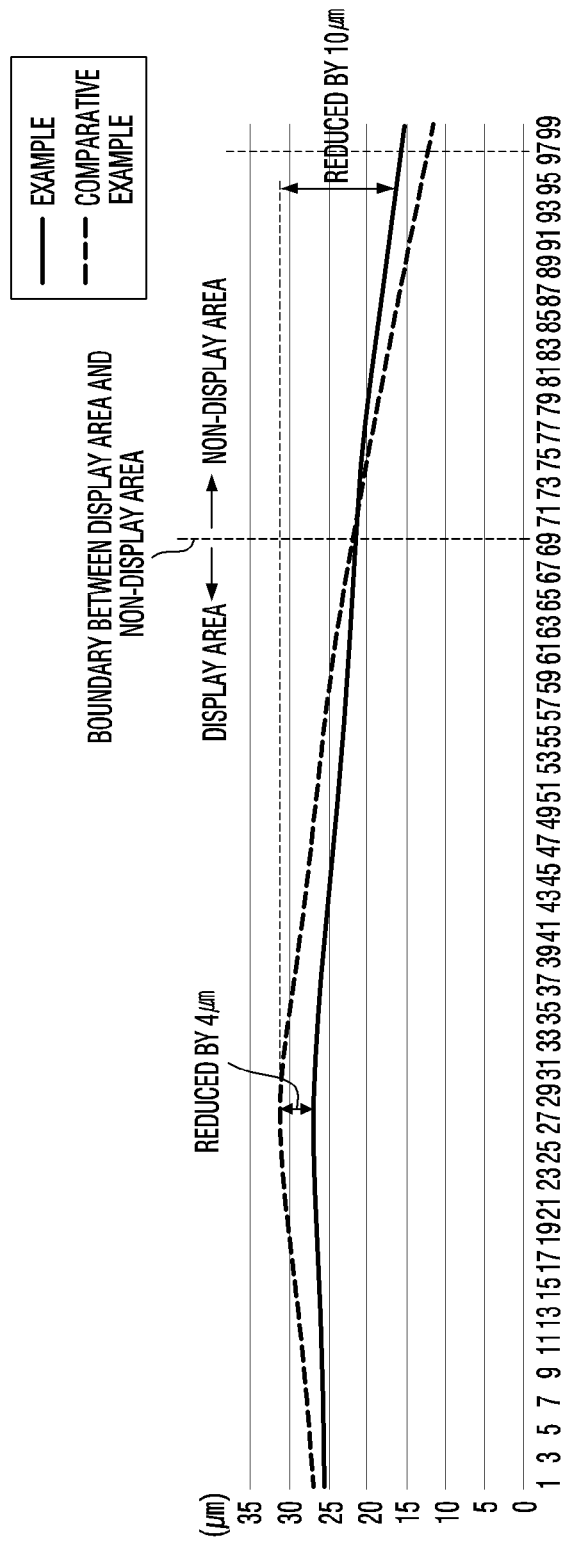
FIG. 26 is a graph showing a thickness of an organic planarization layer at a boundary between a display area and a non-display area according to Example and Comparative Example.

FIG. 26 is a graph showing a thickness of an organic planarization layer at a boundary between a display area and a non-display area according to Example and Comparative Example.

In FIG. 26, the numerical value of the horizontal axis represents 50 μm per 1 (e.g., 10 represents 500 μm). The vertical axis represents the thickness of the organic planarization layer.

Referring to FIG. 26, in Comparative Example where no valley is formed, the largest thickness of the organic planarization layer was approximately 32 μm at the hump. In contrast, in Example (e.g., refer to FIG. 8) where the valleys are formed, the thickness was reduced to approximately 28 μm. In addition, it can be seen that the thickness of the non-display area of Example was greater than that of Comparative Example.

Since the valleys are formed in the display panel, the thickness uniformity of the organic planarization layer, which is seen from the above, may be improved and the issue of mura (or chrominance non-uniformity) on the display panel may be addressed. For example, the difference in luminance may be reduced at the edge of the display area to prevent the mura (or chrominance non-uniformity).

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a plurality of sub-pixels disposed on a display area of the display device and comprising:
      a first electrode;
      a light emitting layer; and
      a second electrode;
   a pixel-defining layer defining emission areas of the plurality of sub-pixels, respectively;
   an organic planarization layer disposed on the pixel-defining layer and comprising:
      one or more valleys overlapping a first area in a plan view; and
      at least one protrusion overlapping a second area in the plan view; and
   a high-refractive planarization layer disposed on the organic planarization layer, wherein
   the first area is located at an edge of the display area,
   the second area is located in a non-display area of the display device.

2. The display device of claim 1, wherein
   the first area is located at least one edge of the display area, and
   the second area contacts the first area and surrounds the display area in the plan view.

3. The display device of claim 2, wherein the second area is extended from a sidewall of the organic planarization layer overlapping the non-display area in @ the plan view toward the display area.

4. The display device of claim 1, wherein the one or more valleys surround the plurality of sub-pixels disposed in the first area in the plan view, and does not overlap the emission areas of the plurality of sub-pixels in the plan view.

5. The display device of claim 1, wherein
   the organic planarization layer comprises openings overlapping the emission areas of the plurality of sub-pixels in the plan view, and
   the one or more valleys surround the openings in the plan view.

6. The display device of claim 5, further comprising:
   a touch sensor layer disposed between the pixel-defining layer and the organic planarization layer, wherein
   the touch sensor layer comprises:
      driving electrodes; and
      sensing electrodes, and
   a width of the one or more valleys is smaller than a distance between the driving electrodes and the openings in the plan view.

7. The display device of claim 5, wherein
   the one or more valleys have a depth from an upper surface of the organic planarization layer, and
   the depth is in a range of about 10% to about 70% of a thickness of the organic planarization layer.

8. The display device of claim 1, wherein
   the one or more valleys surrounding one of the plurality of sub-pixels comprises a plurality of valleys, and
   the plurality of valleys comprise:

a first valley adjacent to the emission area; and a second valley surrounding the first valley.

9. The display device of claim 8, wherein a width and a depth of the first valley are equal to a width and a depth of the second valley, respectively.

10. The display device of claim 8, wherein a depth of the first valley is greater than a depth of the second valley.

11. The display device of claim 1, wherein the at least one protrusion surrounds the display area and protrudes from an upper surface of the organic planarization layer.

12. The display device of claim 11, wherein a taper angle of the at least one protrusion is in a range of about 10 degrees to about 30 degrees with respect to the upper surface of the organic planarization layer.

13. The display device of claim 11, wherein a height of the at least one protrusion is in a range of about 1% to about 10% of a thickness of the organic planarization layer.

14. The display device of claim 11, wherein the at least one protrusion comprises a plurality of protrusions, and the plurality of protrusions comprises:

a first protrusion adjacent to the first area; and a second protrusion surrounding the first protrusion.

15. The display device of claim 14, wherein a height of the first protrusion is equal to a height of the second protrusion.

16. The display device of claim 14, wherein a height of the first protrusion is smaller than a height of the second protrusion.

17. The display device of claim 14, further comprising:

a third protrusion surrounding the second protrusion, wherein a height of the first protrusion, a height of the second protrusion, and a height of the third protrusion decrease toward the display area.

18. The display device of claim 11, wherein the at least one protrusion has an island pattern or a closed-loop shape.

19. A display device comprising:

a plurality of sub-pixels disposed on a display area of the display device and comprising:

a first electrode;

a light emitting layer; and a second electrode;

a pixel-defining layer defining emission areas of the plurality of sub-pixels, respectively;

an organic planarization layer disposed on the pixel-defining layer and comprising valleys overlapping a first area located at an edge of the display area in a plan view, and the organic planarization layer further comprising an opening overlapping the emission area; and a high-refractive planarization layer disposed on the organic planarization layer, wherein the valleys surround the plurality of sub-pixels adjacent to each other and are spaced apart from each other, and widths of the valleys spaced apart from each other gradually decrease from the display area toward a non-display area of the display device.

20. The display device of claim 19, wherein the plurality of sub-pixels comprises:

a first sub-pixel;

a second sub-pixel; and a third sub-pixel, the first sub-pixel, the second sub-pixel, and the third sub-pixel are adjacent to each other in a direction from the non-display area to the display area, the valleys comprise:

a first valley surrounding the first sub-pixel;

a second valley surrounding the second sub-pixel; and a third valley surrounding the third sub-pixel, a width of the second valley is greater than a width of the first valley, and a width of the third valley is greater than the width of the second valley.

21. The display device of claim 19, wherein volumes of the valleys are different from each other, and gradually decrease from the display area toward the non-display area.

* * * * *